(12) United States Patent
Hayashi et al.

(10) Patent No.: US 6,614,063 B2
(45) Date of Patent: Sep. 2, 2003

(54) SOLID ELECTROLYTIC CAPACITOR

(75) Inventors: Chiharu Hayashi, Hirakata (JP); Yasunobu Tsuji, Katano (JP); Hisataka Kato, Yawata (JP); Kazuo Kawahito, Osaka (JP); Yoshiki Hashimoto, Uji (JP); Emiko Igaki, Amagasaki (JP); Hiroshi Shimada, Uji (JP); Mitsuo Terada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 367 days.

(21) Appl. No.: 09/726,400

(22) Filed: Dec. 1, 2000

(65) Prior Publication Data
US 2001/0003501 A1 Jun. 14, 2001

(30) Foreign Application Priority Data

| Dec. 3, 1999 | (JP) | P 11-344485 |
| Dec. 3, 1999 | (JP) | P 11-344486 |
| Jan. 17, 2000 | (JP) | P 2000-007408 |
| Sep. 5, 2000 | (JP) | P 2000-268272 |

(51) Int. Cl.$^7$ .............................................. H01L 29/76
(52) U.S. Cl. .................. 257/213; 361/523; 361/524; 361/528; 75/63
(58) Field of Search ................... 361/523, 524, 361/528; 75/63

(56) References Cited

U.S. PATENT DOCUMENTS

| 4,456,480 A | * | 6/1984 | Wintenberger ............... 75/600 |
| 4,697,001 A | | 9/1987 | Walker et al. |
| 4,785,380 A | | 11/1988 | Harakawa et al. |
| 6,249,424 B1 | * | 6/2001 | Nitoh et al. ................ 361/523 |

FOREIGN PATENT DOCUMENTS

| JP | 60-244017 | 12/1985 |
| JP | 63-181308 | 7/1988 |

* cited by examiner

Primary Examiner—David Nelms
Assistant Examiner—Mai-Huong Tran
(74) Attorney, Agent, or Firm—Wenderoth, Lind & Ponack, L.L.P.

(57) ABSTRACT

A solid electrolytic capacitor includes an anode element made of a valve action metal, a dielectric oxide film formed on a surface of the anode element, a solid electrolytic layer formed on a surface of the dielectric oxide film, and a cathode layer formed on a surface of the solid electrolytic layer. The solid electrolytic layer has an iron concentration not greater than 100 ppm. Alternatively or in combination therewith, a weight fraction of residues in the solid electrolytic layer is smaller than 5 wt %. The polymerization residue is an oxidizing agent and a monomer that is produced when such solid electrolytic layer is formed.

6 Claims, 13 Drawing Sheets

SOLID ELECTROLYTIC CAPACITOR

BACKGROUND OF THE INVENTION

1. Field of the Invention

The present invention relates a solid electrolytic capacitor and a method of making the same and, in particular to the solid electrolytic capacitor of a kind having a solid electrolytic layer made of an electroconductive polymer, and the method of making the same.

2. Description of the Prior Art

With the advent of electronic appliances that are high-frequency oriented, large capacitance electrolytic capacitors that are an electronic component part are desired to have an excellent impedance characteristic (hereinafter referred to as ESR characteristic) in a high frequency region.

A solid electrolytic capacitor is not an exception and, in order to realize this, a surface condition of an anode, a method of forming a dielectric oxide film, improvement of electrolyte, a surface condition of a cathode and the structure of a capacitor element have been studied and examined.

FIG. 12 illustrates a sectional representation of a standard solid electrolytic capacitor 50. The solid electrolytic capacitor 50 includes a capacitor element 25 embedded in a package 29 generally made of an epoxy resin and reinforcing resin 30 with respective portions of anode and cathode terminals 26 and 27 exposed to the outside.

The capacitor element 25 is made up of a porous anode element 20, a dielectric oxide film 22 formed on a surface of the anode element 20, a solid electrolytic layer 23 formed over the dielectric oxide film 22 and a cathode layer 24 formed over the solid electrolytic layer 23.

The porous anode element 20 is obtained by press-shaping a metal powder of tantalum which is a valve action metal to a desired shape and then sintering it, and the anode element 20 has embedded therein an anode lead line 21 made of a tantalum wire. The anode lead line 21 is connected with the anode terminal 26.

On the other hand, the cathode layer 24 is formed by laminating a carbon and a silver paint and is connected with the cathode terminal 27 through an electroconductive bonding agent 28.

A method of making the standard solid electrolytic capacitor 50 will be discussed with reference to FIG. 13 in which there is shown a flowchart showing the sequence of making the solid electrolytic capacitor 50 according to the prior art. As shown therein the tantalum metal powder with the anode lead line 21 in the form of the tantalum wire embedded therein is press-shaped to a desired shape and is then sintered to provide the porous anode element 20.

Subsequently, using phosphoric acid, the anode element 20 is anodized to form the dielectric oxide film 22 on an outer surface of the anode element 20 (Anodizing Step).

Thereafter, after the anode element 20 has been impregnated with a pyrrole monomer solution, the anode element 20 is dipped into an oxidizer solution containing iron(l) p-toluenesulfonic acid, iron dodecylbenzenesulfonic acid and so on so that the solid electrolytic layer 23 can be formed over the dielectric oxide film 22 by means of a chemical oxidation polymerization. See, the Japanese Laid-open Patent Publications No. 60-244017 and No. 63-181308.

The porous anode element 20 is repeatedly dipped into the monomer solution and then into the oxidizer solution as disclosed in, for example, U.S. Pat. No. 4,697,001 to form the solid electrolytic layer 23 on the outer surface of the anode element 20 and also within micropores of the anode element 20.

For the solid electrolytic layer 23, other than pyrrole, an electroconductive polymer formed by polymerization of thiophene, which is a heterocyclic compound, or furan is employed. Since the above described electroconductive polymer has a very low solid resistance, development has been made with the electroconductive polymer regarded as an effective compound to reduce the impedance of the solid electrolytic capacitor and is put into practical use.

Thus, by means of the chemical oxidation polymerization, the solid electrolytic layer 23 made of polypyrrole is formed on the dielectric oxide film 22 on the anode element 20 (Polymerizing Step).

Thereafter, carbon is coated, a silver paint is coated and drying is performed to complete formation of the cathode layer 24, thereby completing the capacitor element 25 (Cathode Layer Forming Step).

Then, the anode lead line 21 extending from the capacitor element 25 is soldered to the anode terminal 26 of a COM terminal and the cathode layer 24 is connected with the cathode terminal 27 through an electroconductive bonding agent 28 (Fabricating Step). The capacitor element 25 is thereafter resin-molded in an epoxy covering resin 29 with respective portions of the anode and cathode terminals 26 and 27 exposed to the outside of the covering resin 29 (Resin-encasing Step). In general, by the sequence discussed above, a batch of capacitors 50 are manufactured at a time with the anode and cathode terminals 26 and 27 of one capacitor 50 continued to those of the next adjacent capacitor 50. Accordingly, as a final step, the capacitors 50 connected together are separated into the individual capacitors 50 which are subsequently tested to provide the individual solid electrolytic capacitors 50 (Finishing Step).

However, the prior art capacitor making method discussed above has the following problems which occur during the polymerizing step in which the solid electrolytic layer 23 is formed.

In the first place, since the chemical oxidation polymerization is repeated a number of times to form the solid electrolytic layer 23 on the outer surface of the anode element 20 and within the micropores of the anode element 20, residues 31 of solid electrolyte tend to be formed on the outer surface of the anode element 20 as shown in FIG. 14 and within the micropores 20P of the anode element 20 as shown in FIG. 15.

It is to be noted that FIGS. 14 and 15 illustrate the anode element 20 obtained after the polymerization step discussed above. Although not shown in FIG. 14, the surface of the anode element 20 is formed with the oxide film 22 and the solid electrolytic layer 23. The plural anode elements 20 are connected to a support bar 3 by means of the respective anode lead lines 21 connected therewith. FIG. 14 makes it clear that the residues 31 are formed on the outer surface of the anode element 20 having the solid electrolytic layer 23. Also, FIG. 15 is a fragmentary enlarged diagram of a portion of the anode element 20, and it makes clear that the residues 31 are formed within the micropores 20P of the anode element 20 formed with the solid electrolytic layer 23. It is to be noted that although not shown in FIG. 15, the dielectric oxide film 22 is formed on the surface of the anode element 20.

The residues 31 of the electrolyte referred to above are made up of lees left during the chemical oxidation polymerization, unpolymerized electroconductive polymer and/or oxidizing agent and they do not only deteriorate an outer appearance of the capacitor element 25 to reduce the volumetric capacity and, hence, to reduce the capacitor characteristic, but may often leak out of the covering resin 29 in the worst case it may occur. It is noted that the term "volumetric capacity" means the degree of ease of encasing the capacitor element within, for example, an epoxy covering resin. Hence, when it comes to a high volumetric capacity, it means that the capacitor element is completely encased easily. Accordingly, in order to remove the residues 31, the use has been made of a brush or the like to remove the residues 31 prior to the cathode layer forming step to render the surface of the solid electrolytic layer 23 to be flat and to repair the outer shape, resulting in reduction in productivity. Also, depending on the condition under which the residues 31 are removed, the solid electrolytic layer 23 may be damaged, resulting in deterioration of the capacitor characteristic.

Secondly, since during the step of forming the solid electrolytic layer 23, the anode element 20 dipped into one of the monomer solution and the oxidizer solution has to be subsequently dipped into the other of the monomer solution and the oxidizer solution, when the anode element 20 dipped into one of the monomer solution and the oxidizer solution is to be dipped into the other of the monomer solution and the oxidizer solution, the solution impregnated in the anode element 20 tends to be diffused into the other solution. Once this occurs, the concentration of each of those solutions particularly within the micropores 20P of the anode element 20 may decrease, resulting in reduction of the coated amount of the solid electrolytic layer 23 and, therefore, deterioration occurs in the capacitance characteristic and the impedance characteristic of the capacitor.

Accordingly, in order form the surface of the porous anode element 20 having its surface formed with the dielectric oxide film 23 to be covered by the continuous solid electrolytic layer 23 so that the intrinsic capacitance can be completely delivered and also to provide the solid electrolytic capacitor capable of exhibiting a low ESR, the step of polymerization necessitated to form the solid electrolytic layer 23 has to be repeated several tens times, resulting in considerable reduction in productivity.

Also, there has been a problem in that the solid electrolytic layer 23 formed by repeating the polymerization step as described above tends to exhibit a high resistance among the solid electrolytic layers 23 and the ESR characteristic does not improve.

Finally, in a method in which the solid electrolytic layer 23 is formed by the chemical oxidation polymerization using the monomer solution and the oxidizer solution, trivalent and bivalent iron ions of the oxidizing agent which did not contribute to the polymerization remain in the solid electrolytic layer 23 after the polymerization. Where the solid electrolytic layer 23 is formed over a detect of the dielectric oxide film 22, those iron ions are reduced to iron under influence of a oxidation reducing potential difference with the dielectric oxide film 22 and will constitute a cause of leakage current and/or shortcircuit, resulting in the yield of production.

SUMMARY OF THE INVENTION

In view of the foregoing numerous problems, the present invention has been devised to eliminate the foregoing problems and is to provide a solid electrolytic capacitor and a method of making the same which is effective to exhibit an excellent productivity and capable of providing a highly reliable product.

In order to accomplish the foregoing object, a solid electrolytic capacitor of the present invention is the one including an anode element made of a valve action metal; a dielectric oxide film formed on a surface of the anode element; a solid electrolytic layer formed on a surface of the dielectric oxide film; and a cathode layer formed on a surface of the solid electrolytic layer, which capacitor is featured in that the solid electrolytic layer has an iron concentration not greater than 100 ppm. This type of the solid electrolytic capacitor exhibits a low leakage current and is less susceptible to shortcircuit.

Also, the solid electrolytic capacitor of the present invention may be the one including an anode element made of a valve action metal; a dielectric oxide film formed on a surface of the anode element; a solid electrolytic layer formed on a surface of the dielectric oxide film; a cathode layer formed on a surface of the solid electrolytic layer, which capacitor is featured in that a weight fraction of residues in the solid electrolytic layer is smaller than 5 wt %. This type of the solid electrolytic capacitor is, since the weight fraction of the residues in the solid electrolytic layer is smaller than 5 wt %, excellent in volumetric capacity with deterioration of the ESR suppressed. It is to be noted that the residues referred to above are formed of one or more of substances contained in an unpolymerized monomer solution, substances contained in an oxidizing agent solution, both of which are remaining after the polymerization reaction, and an excessive polymer which is produced more than a desired amount.

Preferably, the solid electrolytic layer is made of polypyrrole and polythiophene.

In accordance with the present invention, there is also provided a method of making a solid electrolytic capacitor which includes the steps of forming a dielectric oxide film on a surface of a porous anode element made of a valve action metal and having a multiplicity of micropores; forming a first solid electrolytic layer over the dielectric oxide film; and forming a cathode layer over the first solid electrolytic layer, which method is featured in that the first solid electrolytic layer forming step includes a substep of forming a first electroconductive polymer film over the dielectric oxide film by contacting the dielectric oxide film with a solution containing a heterocyclic compound and a monomer comprising its derivative to cause the monomer undergo polymerization; a substep of cleansing the first electroconductive polymer film to remove a residue remaining in the first electroconductive polymer film; and a substep of drying the first electroconductive polymer film.

As described above, by removing the residues produced during the polymerization for the first electroconductive polymer film from the first electroconductive polymer film by cleansing the first electroconductive polymer film during the first solid electrolytic layer forming step, the solid electrolytic layer having an uniform thickness can be formed so that the solid electrolytic capacitors of an excellent quality can be manufactured.

Preferably, during the first solid electrolytic layer forming step the first electroconductive polymer film is formed by causing the monomer to undergo a chemical oxidation polymerization using an oxidizing agent. If the first solid electrolytic layer forming step is repeated a number of times, the uniform solid electrolytic layer having a sufficient thickness can be formed.

Also preferably, the substep of cleansing the first electroconductive polymer film includes at least one of a step of removing the residue in the first electroconductive polymer film on a surface of the anode element and a step of removing the residue in the first electroconductive polymer film within the micropores of the anode element. This is because the residue can assuredly be removed from the first electroconductive polymer film.

The step of removing the residue in the first electroconductive polymer film on the surface of the anode element may be carried out by using at least one of (1) a shower cleansing method in which one of a liquid medium including water, hot water and an organic solvent, air and gas, (2) an ultrasonic cleansing method in which the liquid medium is used, (3) a method in which while the anode element is immersed in the liquid medium a voltage is applied with the anode element used as an anode, and (3) blasting.

Preferably, the step of removing the residue in the first electroconductive polymer film within the micropores of the anode element is carried out by using a liquid medium including water, hot water and an organic solvent or an ultrasonic cleansing method using the liquid medium. In such case, the organic solvent may include an organic acid and its salt and has a molecular structure having concurrently a hydroxyl group and a carboxyl group, because by the action of the hydroxyl and carboxyl groups in the molecules the iron ions form a complex that is stable in the solution and, therefore, reduction of the iron concentration from the solid electrolytic layer can be facilitated.

The shower cleansing may carried out by jetting one of the liquid medium, the air and the gas from above or below or the both. In such case, the shower cleansing is preferably carried out by jetting one of the liquid medium, the air and the gas towards the anode element for ten seconds under pressure not lower than 0.5 kg/cm$^2$.

The first solid electrolytic layer forming step may further include a substep of repairing the dielectric oxide film subsequent to the first electroconductive polymer film cleansing substep. In this case, even though the dielectric oxide film is damaged as a result of the cleansing, it can readily be repaired.

Alternatively, the first solid electrolytic layer forming step may further includes a substep of repairing the dielectric oxide film prior to the first electroconductive polymer film cleansing substep. In such case, it is possible to render the dielectric oxide film to be less susceptible to damage which would otherwise be brought about by the cleansing.

Preferably, the first electroconductive polymer film drying substep includes drying the first electroconductive polymer film under vacuum. If the drying is effected under vacuum, the first electroconductive polymer film is free from oxygen deterioration and, therefore, the high-performance, qualitatively stabilized solid electrolytic layer can be formed advantageously.

Subsequent or prior to the first solid electrolyte layer forming step a step of forming a second solid electrolytic layer may be employed and, in such case, the second solid electrolytic layer forming step includes a substep of forming the first electroconductive polymer film using a condition different from a condition used to form the first electroconductive polymer film in the first solid electrolytic layer forming step. This is particularly advantageous in that the solid electrolytic layer can be uniformly formed deep within the micropores of the anode element.

Similarly, subsequent to the first solid electrolyte layer forming step, both a step of forming a second solid electrolytic layer and a step of forming a third solid electrolytic layer may be employed, in which case the second solid electrolytic layer forming step includes a substep of forming the first electroconductive polymer film using a condition different from a condition used to form the first electroconductive polymer film in the first solid electrolytic layer forming step. The third solid electrolytic layer forming step includes a substep of forming a second electroconductive polymer film different from the first electroconductive polymer film.

The first solid electrolytic layer forming step may include a substep of forming the first electroconductive polymer film forming by means of a chemical oxidation polymerization that is effected by dipping the anode element in a solution containing an oxidizing agent (oxidizer solution) and having a pH value not greater than 4 after the anode element has been dipped into the solution containing the monomer. The use of the oxidizer solution of a pH value not greater than 4 is effective to facilitate a reaction speed of the chemical oxidation polymerization and, therefore, when the anode element impregnated with the polymerization solution is subsequently dipped into the oxidizer solution, the chemical oxidation polymerization can be initiated before the polymerization solution dissolves into the oxidizer solution. Therefore, the first solid electrolytic layer having a sufficient thickness can be formed within the micropores of the porous anode element and, consequently, the number of film forming required to form the first solid electrolytic layer can be reduced as compared with that according to the prior art.

The second solid electrolytic layer forming step may include a substep of forming the first electroconductive polymer film forming by means of a chemical oxidation polymerization that is effected by dipping the anode element in a solution containing an oxidizing agent and having a pH value not greater than 4 after the anode element has been dipped into the solution containing the monomer.

It is preferred that the second solid electrolytic layer forming step includes a substep of cleansing the first electroconductive polymer film to remove the residue remaining in the first electroconductive polymer film.

Preferably, the third solid electrolytic layer forming step may include a substep of cleansing the second electroconductive polymer film to remove the residue remaining in the second electroconductive polymer film.

Also preferably, the second solid electrolytic layer forming step includes a substep of dipping the anode element into a solution containing the monomer; a substep of dipping the anode element into a solution containing an oxidizing agent; and a substep of holding in air the anode element which has been removed out of the solution containing the oxidizing agent. In such case, the second solid electrolytic layer forming step is performed at least one time.

The second solid electrolytic layer forming step may also includes a substep of dipping the anode element into a solution containing the monomer; a substep of dipping the anode element into a solution containing an oxidizing agent; and a substep of holding in air the anode element which has been removed out of the solution containing the oxidizing agent, in which case the second solid electrolytic layer forming step is performed at least one time.

Preferably, during the substep of holding in the air the anode element is held in the air of a temperature equal to or higher than a temperature of the solution containing the oxidizing agent.

Furthermore, the third solid electrolytic layer forming step may include a substep of dipping the anode element into a suspension containing the monomer, the oxidizing agent and particles of the second electroconductive polymer; and a substep of holding in air the anode element which has been removed out of the suspension, in which case the third solid electrolytic layer forming step is performed at least one time.

The suspension preferably contains the particles of the second electroconductive polymer prepared by mixing the monomer and the oxidizing agent, and the monomer added after the particles of the second electroconductive polymer have been prepared.

Moreover, a step of heat treating the anode element having the first solid electrolytic layer formed thereon may be carried out prior to or after the cathode layer forming step. This heat treatment is effective to completely remove the organic matter remaining in the solid electrolytic layer and also to immobilize the solid electrolytic layer.

The heat treating step is preferably carried out at a temperature within the range of 200 to 280° C.

The first solid electrolytic layer forming step may be carried out intermediate between the second solid electrolytic layer forming step and the third solid electrolytic layer forming step.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE EMBODIMENTS

This application is based on application Ser. Nos. 11-344485, 2000-7408, 2000-268272 and 11-344486 filed in Japan, the content of which is incorporated herein by reference.

First Embodiments

Figure 1:
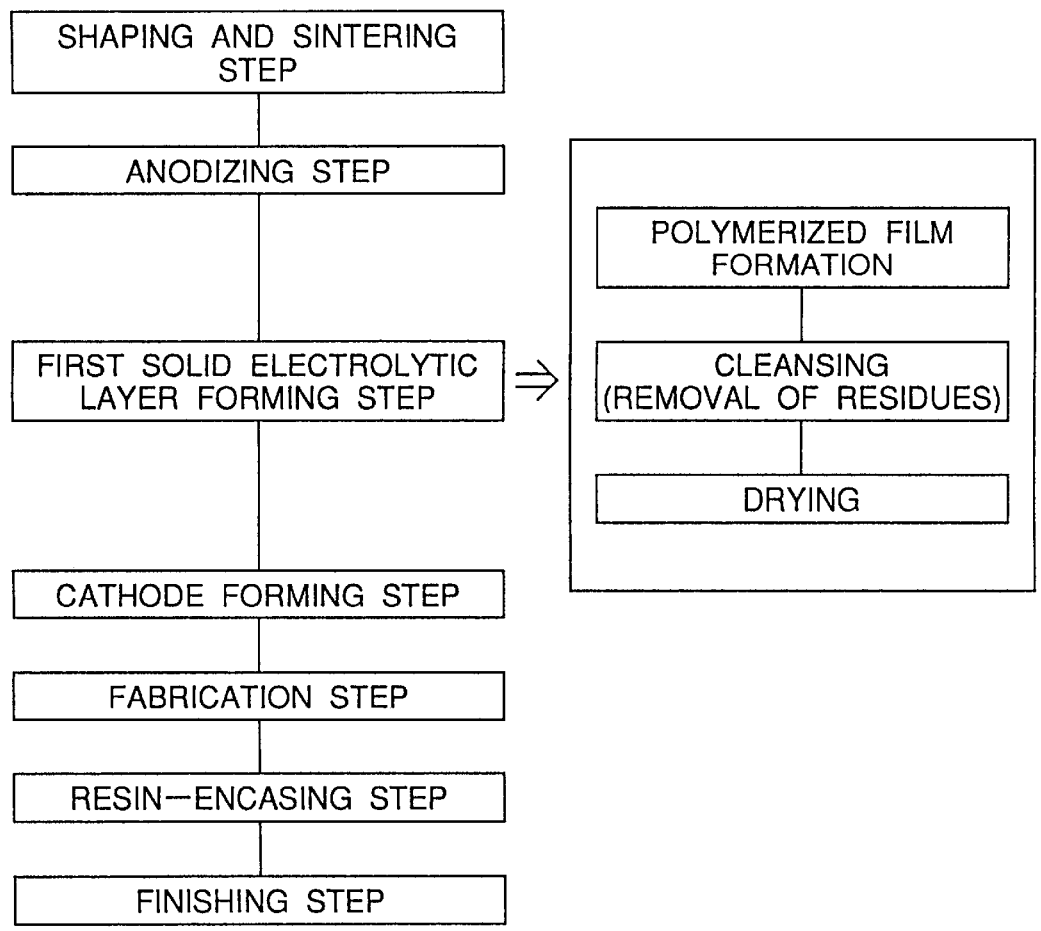
FIG. 1 is a flowchart showing the sequence of manufacture of a solid electrolytic capacitor according to a first embodiment of the present invention.
Figure 12:
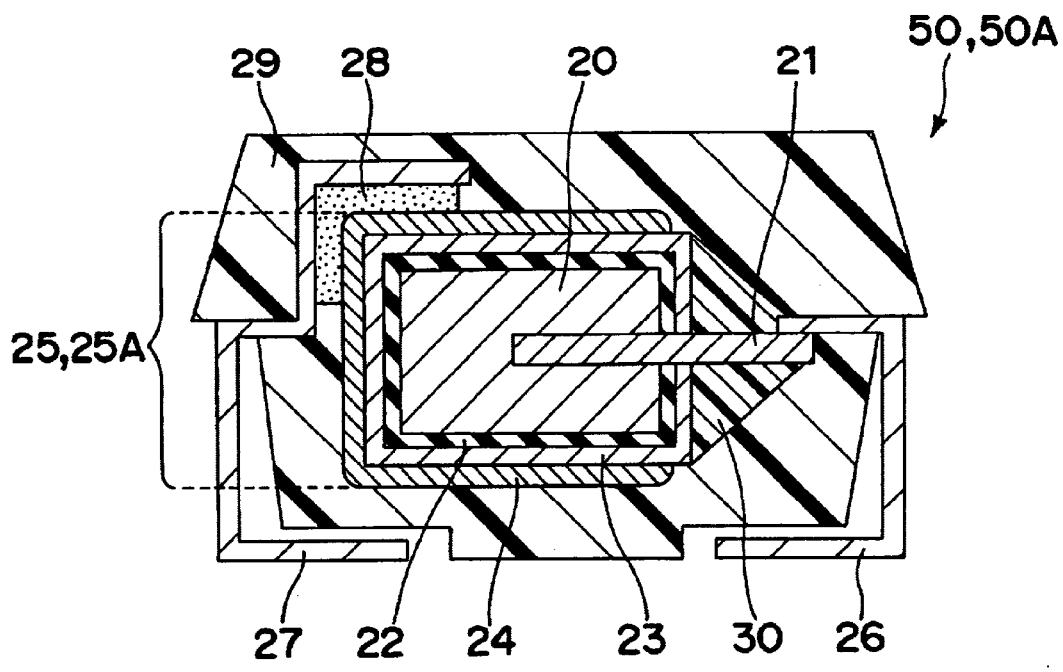
FIG. 12 is a schematic sectional view showing a standard solid electrolytic capacitor.
Figure 13:
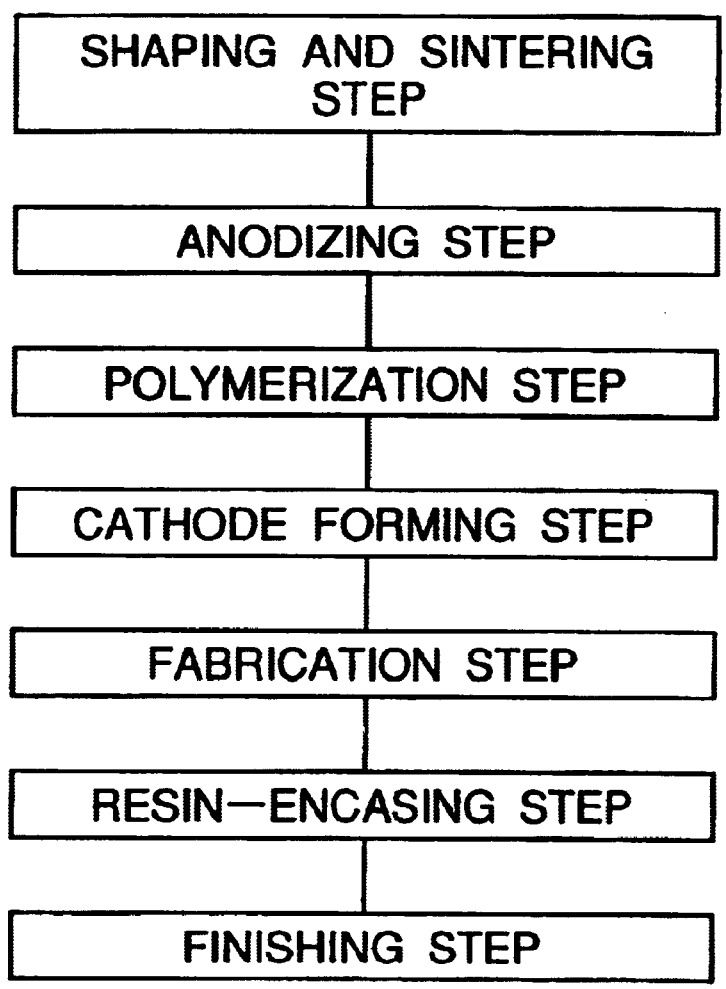
FIG. 13 is a flowchart showing the sequence of manufacture of the solid electrolytic capacitor according to the prior art.
Figure 14:
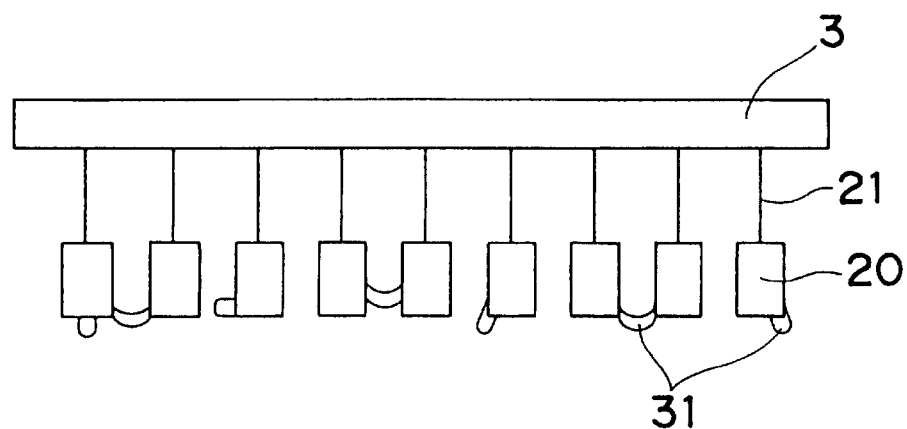
FIG. 14 is a schematic diagram showing an anode element after polymerization in the practice of the conventional method of making the solid electrolytic capacitor.
Figure 15:
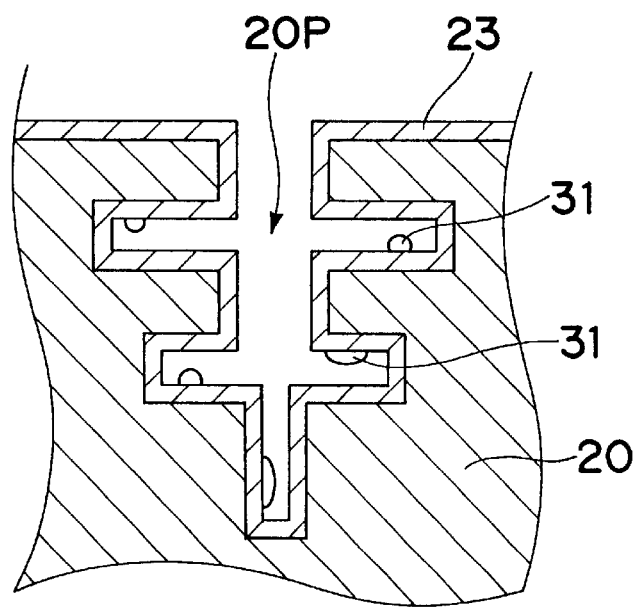
FIG. 15 is a fragmentary enlarged diagram showing the anode element after polymerization according to the conventional method of making the solid electrolytic capacitor.

In FIG. 1, there is shown a flowchart of the sequence of making a solid electrolytic capacitor 50A according to a first embodiment of the present invention. A method of making the solid electrolytic capacitor 50A in this embodiment will now be described with reference to FIGS. 1 and 12. It is, however, to be noted that the solid electrolytic capacitor 50A referred to in connection with the present invention is of a structure substantially identical with that of the standard solid electrolytic capacitor 50 discussed in connection with the prior art.

At the outset, the anode lead line 21 in the form of a tantalum wire is embedded in a mass of tantalum metal powder which is then shaped by a press to a desired shape and sintered to provide the porous anode element 20. Shaping and Sintering Step Subsequently, the anode element 20 is anodized using phosphoric acid to thereby form a dielectric oxide film 22 over an outer surface of the anode element 20 (Anodizing Step).

After the anodizing step, a solution containing pyrrole monomer is uniformly dispersed over the outer surface of the anode element 20 and into micropores 20P (See FIG. 4) in the anode element 20, followed by formation of a polypyrrole film over the dielectric oxide film 22 by means of a chemical oxidation polymerization by contacting it with an oxide solution. Alternatively, after the oxide solution has been uniformly dispersed over the outer surface of the anode element 20 and into the micropores 20P in the anode element 20, a chemical oxidation polymerization may be effected by contacting it with the pyrrole monomer solution to thereby form the polypyrrole film.

The pyrrole monomer solution referred to above is prepared by dissolving in an aqueous solution of 10 wt % ethylene glycol, 1.0 mol/l of pyrrole and 0.25 mol/l of a dopant employed in the form of sodium alkylnaphthalenesulfonate. The oxide solution referred to above is prepared by dissolving in an aqueous solution of 10 wt % ethylene glycol, 0.75 mol/l of an oxidizing agent in the form of ferric sulfate (III), 0.05 mol/l of a dopant in the form of sodium alkylnaphthalenesulfonate and 0.75 mol/l of an additive in the form of sulfuric acid.

Thereafter, residues of the unpolymerized monomer and the oxidizing agent that are produced during formation of the polypyrrole film and remain in the polypyrrole film are removed by cleansing (as will be described in detail later), followed by drying of the cleansed polypyrrole film. In this way, the solid electrolytic layer 23A made of polypyrrole is formed over the dielectric oxide film 22 of the anode element 20 (First Solid Electrolytic Layer Forming Step).

Carbon is then coated over the solid electrolytic layer 23A of the anode element 20, followed by coating of a silver paint which is subsequently dried to form the cathode layer 24 (Cathode Forming Step) to thereby provide a capacitor element 25A.

The anode lead line 21 extending from the capacitor element 25A is soldered to an anode terminal 26 of a COM terminal and the cathode layer 24 is connected with the cathode terminal 27 through an electroconductive bonding agent 28 (Fabricating Step). The capacitor element 25A is thereafter resin-molded in an epoxy covering resin 29 with respective portions of the anode and cathode terminals 26 and 27 exposed to the outside of the covering resin 29 (Resin-encasing Step).

In general, by the sequence discussed above, a batch of capacitors 50A are manufactured at a time with the anode and cathode terminals 26 and 27 of one capacitor 50A continued to those of the next adjacent capacitor 50A. Accordingly, as a final step, the capacitors 50A connected together are separated into the individual capacitors 50A which are subsequently tested to provide the individual solid electrolytic capacitors 50A (Finishing Step).

Figure 2:
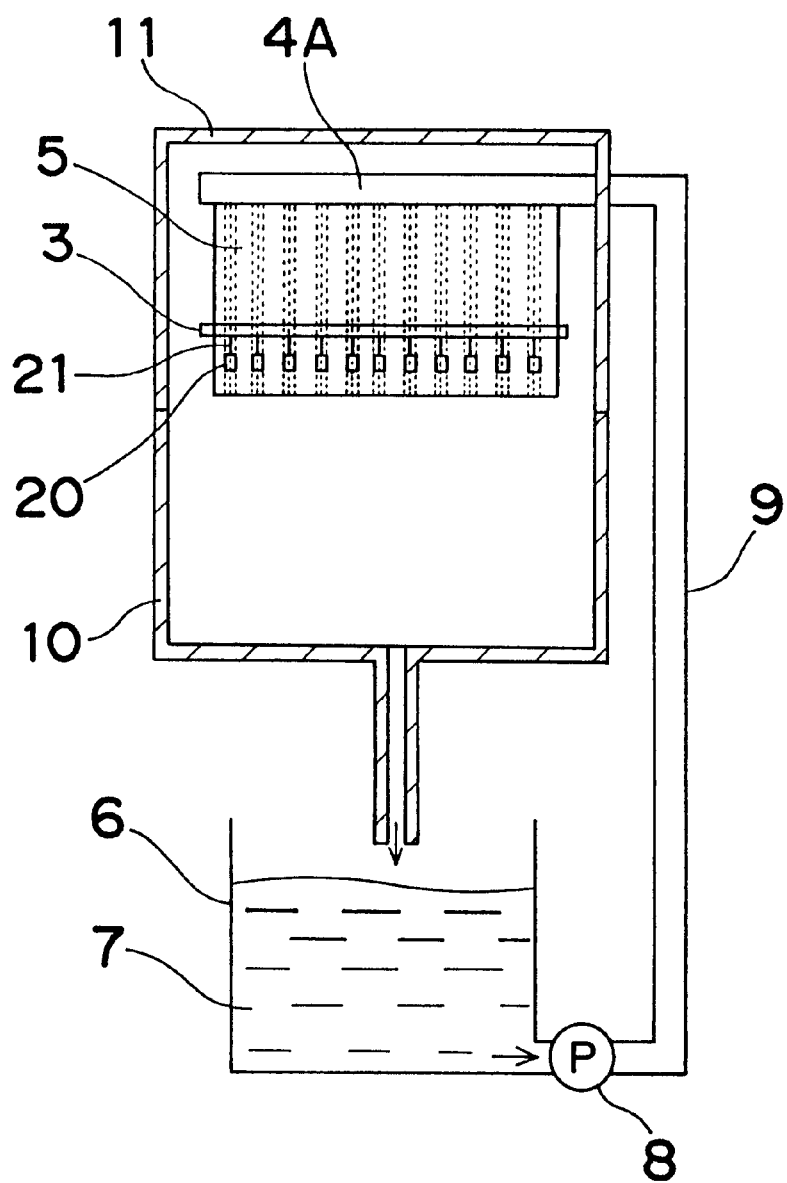
FIG. 2 is a schematic front sectional view of a cleansing apparatus used in the first embodiment of the present invention.

The cleansing process that is carried out during the first solid electrolytic layer forming step discussed above will be described in detail with reference to FIG. 2 showing the cleansing apparatus.

The cleansing apparatus shown in FIG. 2 includes a shower nozzle 4A disposed above an array of anode elements 20, which would subsequently provide the capacitor elements 25A, for showering the anode elements 20, a support bar 3 for supporting the array of the anode elements 20 to be cleansed, a water tank 6 filled with a quantity of water 6, a pump 8 for pumping water 6 within the water tank 6 under pressure towards the shower nozzle 4A through a piping 9, a shower chamber 10 and a lid 11. The anode lead lines 21 connected with the respective anode elements 20 are welded to the support bar 3 in spaced relation to each other. The shower nozzle 4A has a multiplicity of perforations or grooves (not shown) from which water 5 can be showered onto the anode elements 20. It is to be noted that each of the anode elements 20 shown in FIG. 2 has the dielectric oxide film 22 deposited on an outer surface thereof and the solid electrolytic layer 23A formed over the dielectric oxide film 22.

Using the cleansing apparatus of the structure described above, water was jetted from the shower nozzle 4A cyclically for 10 seconds under a pressure of 1.0 kg/cm$^2$ for each cycle. Similarly, water pressures of 0.3 kg/cm$^2$, 0.5 kg/cm$^2$, 1.0 kg/cm$^2$ and 1.5 kg/cm$^2$ were employed to cleanse the different batches of the anode elements 20. Respective results of cleansing are shown in Table 1 below in terms of the amount of residues left unremoved from the cleansed anode elements 20.

TABLE 1

| Nozzle | Shower Pressure | Amount of Residue |
| --- | --- | --- |
| 4A | 0.3 kg/cm$^2$ | 15 wt % |
|  | 0.5 kg/cm$^2$ | 5 wt % |
|  | 1.0 kg/cm$^2$ | 2 wt % |
|  | 1.5 kg/cm$^2$ | 0 wt % |

As can be seen from Table 1 above, 0.5 kg/cm$^2$ or higher is preferred for the pressure of water to be jetted from the shower nozzle 4A towards the anode elements 20.

Figure 3:
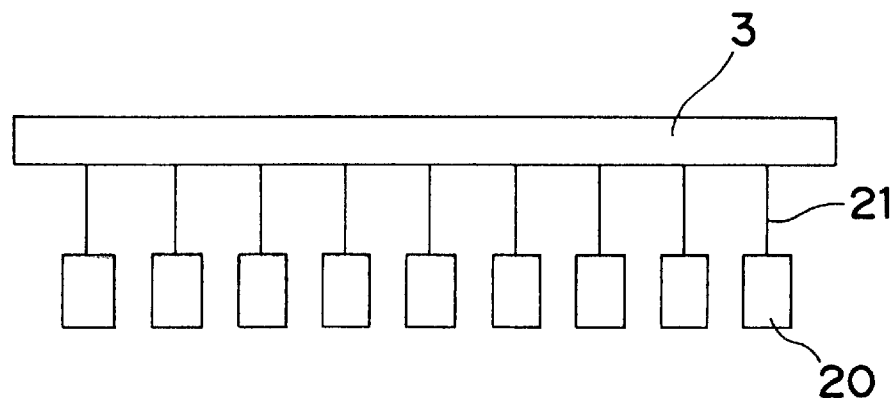
FIG. 3 is a schematic diagram showing anode elements after they have been cleansed.

FIG. 3 schematically illustrate one of the anode elements 20 after it has been cleansed. Each anode element 20 shown therein has the dielectric oxide film 22 deposited on an outer surface thereof and the solid electrolytic layer 23A formed over the dielectric oxide film 22, as is the case with that shown in FIG. 2. As shown in FIG. 3, each of the anode elements 20 connected with the support bat 3 has an outer surface formed uniformly with the solid electrolyte layer 23A made of polypyrrole and the residues were completely removed.

As hereinabove described, according to the first embodiment of the present invention, during the solid electrolyte layer forming step, the cleansing process is employed to remove the residues which tend to be formed during formation of the polymerized film, making it possible to form the uniform solid electrolytic layer and, hence, high-quality solid electrolytic capacitors can be manufactured.

Second Embodiment

The method of making the solid electrolytic capacitor according to the second embodiment of the present invention is substantially similar to that according to the first embodiment, except that in the second embodiment, in order to remove the residues left in the solid electrolytic layer as a result of polymerization, the cleansing process is carried out to remove the residues present on the outer surface of the anode element and also to remote the residues present within micropores in the anode element.

To remove the residues on the outer surface of the anode element 20, a shower cleansing, an ultrasonic cleansing or a blasting, with the use of a liquid medium such as water, hot water or an organic solvent, air or gas may be employed. On the other hand, to remove the residues within the micropores in the anode element, a cleansing or an ultrasonic cleansing, with the use of a liquid medium such as water, hot water or an organic solvent, air or gas may be employed.

Figure 4:
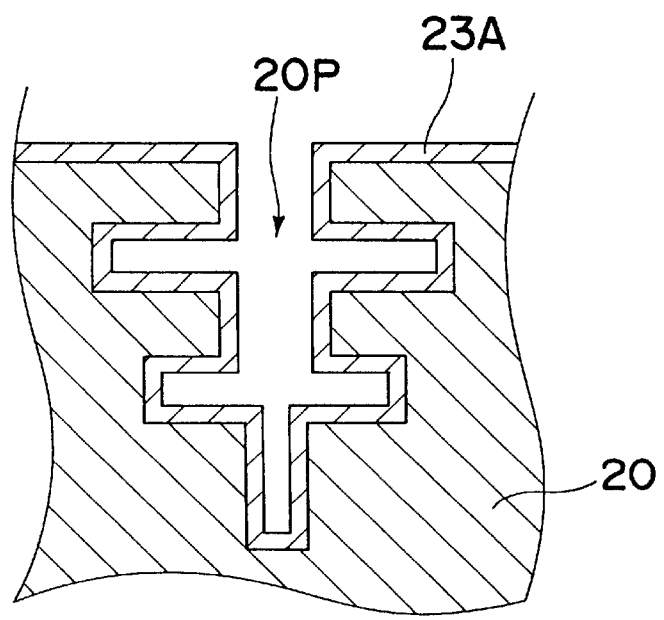
FIG. 4 is a schematic diagram, on an enlarged scale, of a portion of one of the cleansed anode elements, showing how residues within micropores in the anode elements are removed.

The method of making the solid electrolytic capacitor according to the second embodiment of the present invention will be described with reference to FIGS. 3 and 4.

As discussed above, when during the formation of the solid electrolytic layer 23A made of polypyrrole, pyrrole is polymerized, residues such as unpolymerized monomer and oxidizing agent remnants are produced. Most of these residues are found on the outer surface of each anode element 20 and within micropores 20P of the respective anode element 20. Although the residues on the outer surface of each anode element 20 can be removed by means of the shower cleansing using water (rather, hot water is more effective) or air, the residues within the micropores 20P of each anode element 20 can be effectively removed by the use of an ultrasonic cleansing technique.

FIG. 3 illustrates the anode elements 20 having been cleansed to remove the residues on the outer surfaces thereof. FIG. 4 illustrates, on a fragmentary enlarged scale, a portion of any one of the anode elements 20 after the cleansing has been effected to remove the residues within the micropores 20P of each anode element 20. FIG. 3 makes it clear that the residues on the outer surfaces of the anode elements 20 have been effectively removed. Also, FIG. 4 makes it clear that the residues within the micropores 20P of each anode element 20 have been removed. Each anode element 20 shown in FIGS. 3 and 4 has the dielectric oxide film 22 deposited on an outer surface thereof and the solid electrolytic layer 23A formed over the dielectric oxide film 22.

With the capacitor making method according to the second embodiment of the present invention, since cleansing to remove the residues on the outer surface of the anode element 20 and cleansing to remove the residues within the micropores 20P of the anode element 20 are carried out, the residues left subsequent to polymerization during the formation of the solid electrolytic layer 23A can be removed effectively, thereby making it possible to provide a high-quality solid electrolytic capacitor.

It is to be noted that in the second embodiment of the present invention, the cleansing to remove the residues from the outer surface of the anode element 20 may be performed prior to or subsequent to the cleansing to remove the residues from the micropores 20P of the anode element 20 and that one of those cleansings may be sufficient although the both are preferably employed.

Third Embodiment

As discussed above in connection with the first and second embodiments of the present invention, after or prior to the cleansing of the solid electrolytic layer 23 during the first solid electrolytic layer forming step, the dielectric oxide film 22 is preferably repaired.

The capacitor making method according to the third embodiment of the present invention differs from the previously described second embodiment in that during the first solid electrolytic layer forming step, the dielectric oxide film is repaired after the cleansing to remove the residues within the micropores of the anode element.

The capacitor making method according to the third embodiment will now be described.

To remove the residues produced during the formation of the solid electrolyte layer 23A made of pyrrole, after the residues within the micropores 20P of the anode element 20 have been removed therefrom by cleansing, the dielectric oxide film 22 is repaired by anodization.

According to the third embodiment, after the residues within the micropores 20P of the anode element 20 have been removed by cleansing, the dielectric oxide film 22 is repaired. Accordingly, even though the dielectric oxide film 22 is damaged as a result of the cleansing to remove the residue, the dielectric oxide film 22 can be repaired. Accordingly, the solid electrolytic capacitor of a high performance can be manufactured.

Fourth Embodiment

The capacitor making method according to the fourth embodiment of the present invention differs from that according to the second embodiment in that during the first solid electrolytic layer forming step, the dielectric oxide film is repaired prior to the cleansing to remove the residues on the outer surface of the anode element.

More specifically, according to the fourth embodiment, to remove the residues produced during the formation of the solid electrolytic layer 23A made of polypyrrole, prior to the outer surface of the anode element 20 being cleansed, the dielectric oxide film 22 is repaired by anodization.

According to the fourth embodiment, since prior to the removal by cleansing of the residues from the outer surface of the anode element 20 the dielectric oxide film 22 is repaired, it is possible to render the dielectric oxide film to have a resistance to a damage which would be brought about as a result of the cleansing to remove the residue.

Fifth Embodiment

The capacitor making method according to the fifth embodiment of the present invention differs from that according to the first embodiment in that the first solid electrolytic layer forming step is repeated a number of times as will now be described.

As described in connection with the first embodiment of the present invention, the solid electrolyte layer 23A made of polypyrrole is formed by chemical oxidation polymerization of pyrrole. Since the thickness of the polymerized film formed by a single polymerization is limited, the same step is repeated a desired number of times to form the qualitatively stabilized solid electrolytic layer 23A having an increased film thickness. Accordingly, it is possible to provide the solid electrolytic capacitor of a high performance.

Sixth Embodiment

The capacitor making method according to the sixth embodiment of the present invention differs from that according to the first embodiment in that during the first solid electrolytic layer forming step, the drying after the cleansing is carried out under vacuum as will now be described.

As described in connection with the first embodiment of the present invention, the solid electrolyte layer 23A made of polypyrrole is formed by forming a polymerized film of polypyrrole by means of a chemical oxidation polymerization of pyrrole, cleansing and finally drying it. If the drying is effected under a vacuum atmosphere, the polymerized film of polypyrrole will not be oxidized and hence deteriorated, and accordingly, the quantitatively stabilized solid electrolytic layer 23 of a high performance can be formed, thereby making it possible to provide the solid electrolytic capacitor of a high performance.

Seventh Embodiment

The capacitor making method according to the seventh embodiment of the present invention differs from that according to the first embodiment in that during the first solid electrolytic layer forming step, the shower cleansing is effected from above the anode elements or below the anode element or the both, for at least 10 seconds under a pressure equal to or higher than $0.5$ $kg/cm^2$.

The capacitor making method according to the seventh embodiment of the present invention will now be described with reference to FIGS. 5 and 6.

Figure 5:
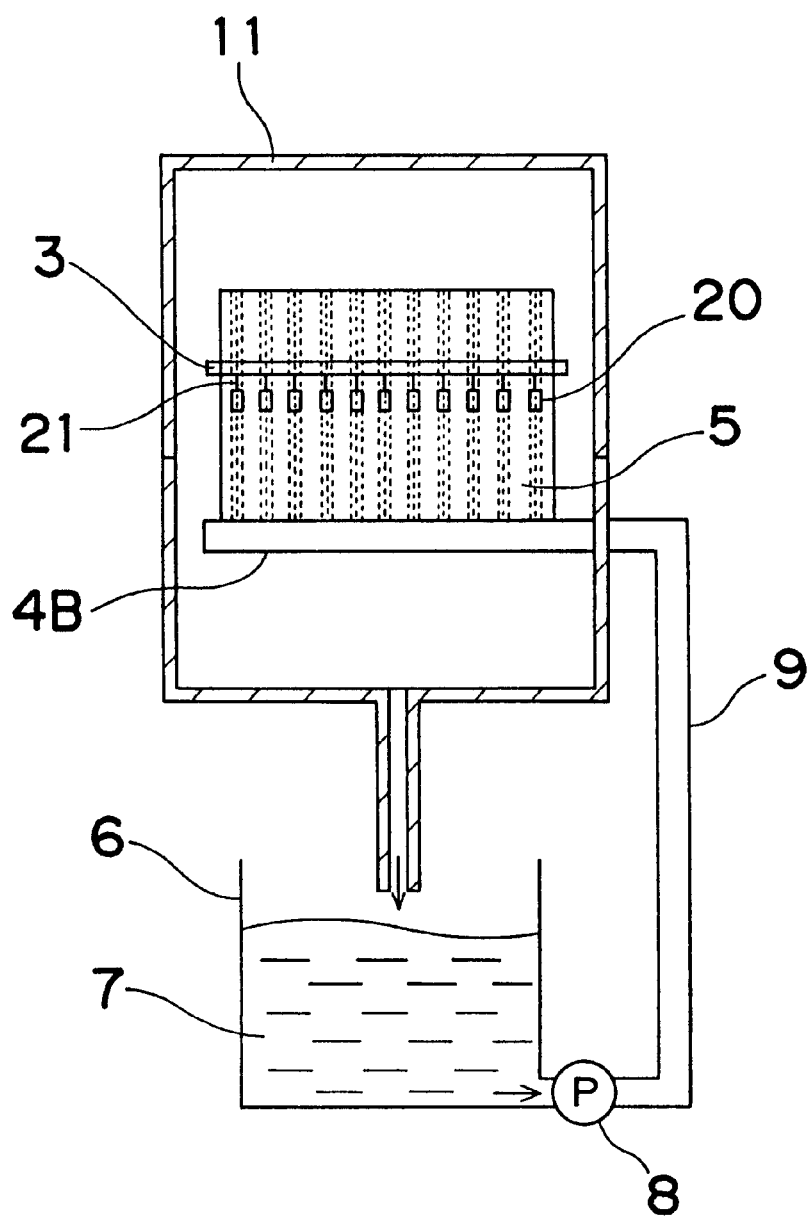
FIG. 5 is a schematic front sectional view of a cleansing apparatus used in a seventh embodiment of the present invention.
Figure 6:
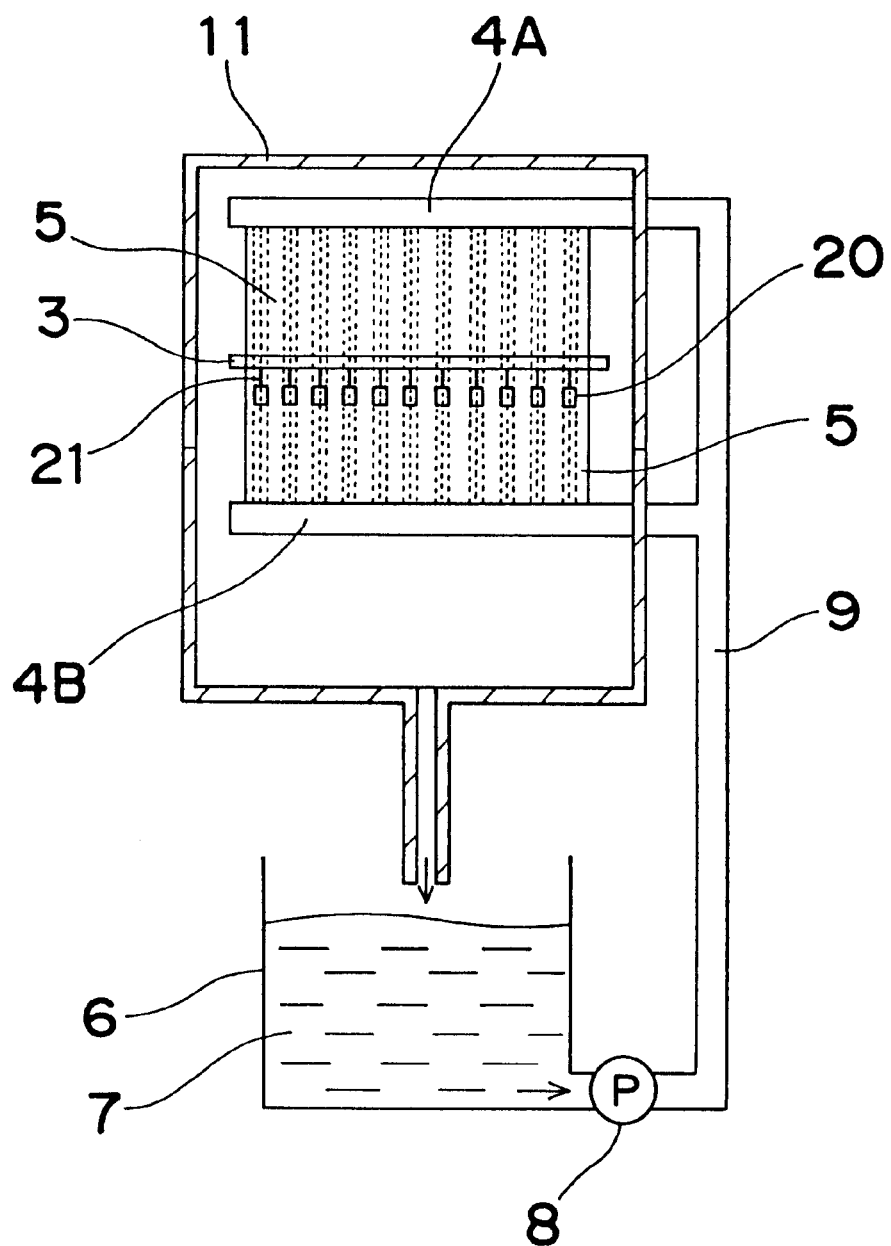
FIG. 6 is a schematic front sectional view of a cleansing apparatus used in the seventh embodiment of the present invention.

FIG. 5 schematically illustrates the cleansing apparatus that can be employed in the practice of the seventh embodiment and that is so designed as to effect the shower cleansing from below the array of the anode elements 20. As shown therein, a shower nozzle 4B is disposed below the array of the anode elements 20 for jetting water therefrom under a pressure of $1.0$ $kg/cm^2$ cyclically for 10 seconds. Even with the seventh embodiment of the present invention, similar cleansing effects to those obtained according to the first embodiment can be obtained. Similarly, water pressures of $0.3$ $kg/cm^2$, $0.5$ $kg/cm^2$, $1.0$ $kg/cm^2$ and $1.5$ $kg/cm^2$ were employed to cleanse the different batches of the anode elements 20. Respective results of cleansing are shown in Table 2 below in terms of the amount of residues left unremoved from the cleansed anode elements 20.

TABLE 2

| Nozzle | Shower Pressure | Amount of Residue |
|---|---|---|
| 4B | $0.3$ $kg/cm^2$ | 7 wt % |
| | $0.5$ $kg/cm^2$ | 1 wt % |
| | $1.0$ $kg/cm^2$ | 0 wt % |
| | $1.5$ $kg/cm^2$ | 0 wt % |

As can be seen from Table 2 above, $0.5$ $kg/cm^2$ or higher is preferred for the pressure of water to be jetted from the shower nozzle 4B towards the anode elements 20.

The shower cleansing may be effected not only from below the array of the anode element, but also from above the array of the anode element as represented by the apparatus shown in FIG. 6. As shown therein, the shower nozzle 4A is disposed above the array of the anode element 20 whereas the shower nozzle 4B is disposed below the array of the anode element 20. The shower nozzle 4B showers water under a pressure of 1.0 kg/cm$^2$ cyclically for 10 seconds whereas the shower nozzle 4B showers water under a pressure of 0.5 kg/cm$^2$ cyclically for 10 seconds. With the array of the anode elements 20 cleansed from above and below thereof, the highly precise cleansing to remove the residues is possible. Accordingly, it is possible to provide the solid electrolytic capacitors of a high performance.

Eighth Embodiment

The capacitor making method according to the eighth embodiment of the present invention differs from that according to the first embodiment in that before or after the first solid electrolytic layer forming step, a second solid electrolyte layer forming step is employed to form a solid electrolyte layer under a different condition. The eighth embodiment of the present invention is effective to provide the solid electrolytic capacitors of an enhanced high performance.

Figure 7:
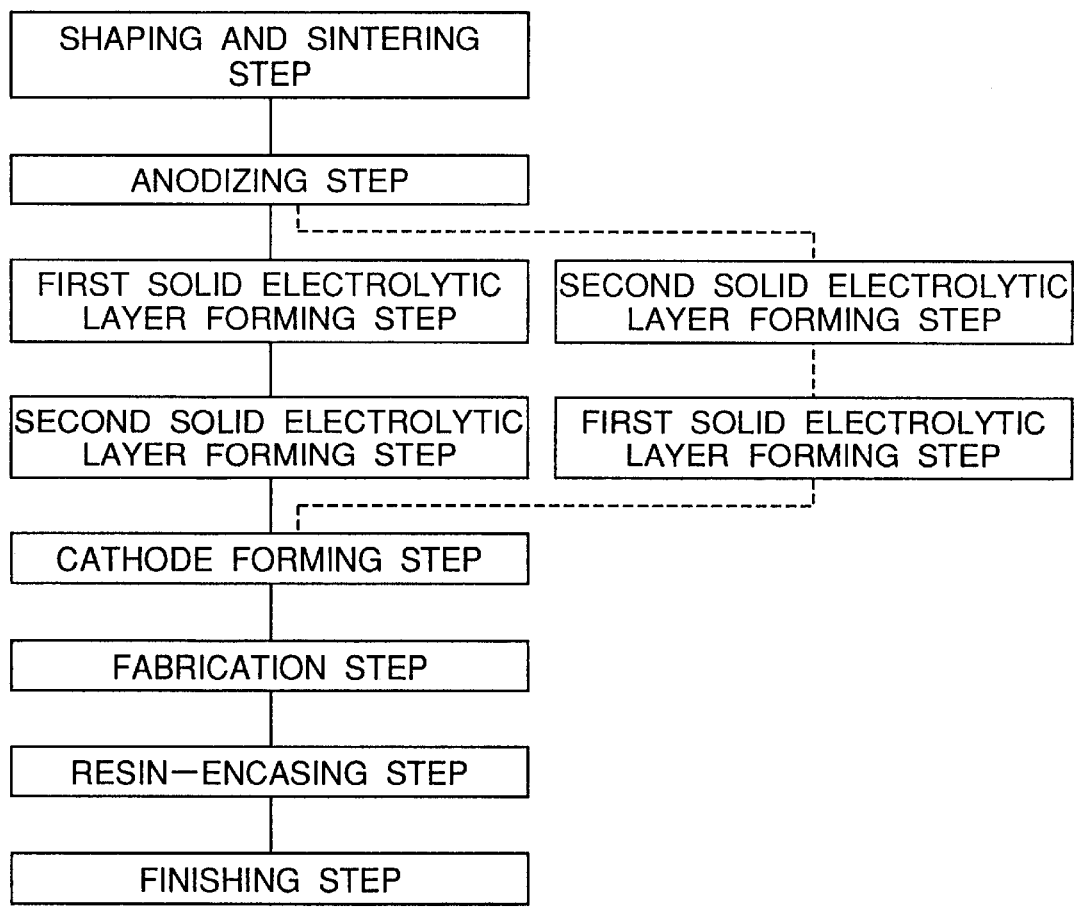
FIG. 7 is a flowchart showing the sequence of manufacture of the solid electrolytic capacitor according to an eighth embodiment of the present invention.

Referring specifically to FIG. 7, there is shown a flow-chart for the capacitor making method according to the eighth embodiment. As described above, the capacitor making method according to the eighth embodiment employs the second solid electrolytic layer forming step that is performed before or after the first solid electrolytic layer forming step described in connection with the first embodiment. The first and second solid electrolytic layers formed respectively during the first and second solid electrolytic layer forming steps are made of an electroconductive polymer, but under different conditions which will now be described.

In the first place, the second solid electrolytic layer forming step will be described in detail. It is, however, to be noted that during the second solid electrolytic layer forming step employed in the eighth embodiment, a pyrrole monomer solution of a concentration different from that employed to form the first solid electrolytic layer to form the second solid electrolytic layer.

More specifically, the monomer solution is prepared by dissolving in an aqueous solution of 10 wt % ethylene glycol, pyrrole as a monomer in a concentration of 0.75 mol/l and sodium alkylnaphthalenesulfonate in a concentration of 0.25 mol/l. Also, the oxide solution is prepared by dissolving in an aqueous solution of 10 wt % ethylene glycol, ferric sulfate (III) as an oxidizing agent in a concentration of 0.75 mol/l, sodium alkylnaphthalenesulfonate as a dopant in a concentration of 0.05 mol/l and sulfuric acid as an additive in a concentration of 0.75 mol/l.

After the monomer solution has been uniformly dispersed over the solid electrolytic layer 23 formed as a result of the first solid electrolytic layer forming step discussed in connection with the first embodiment, it is contacted with the oxide solution to form a polypyrrole polymerized film by means of a chemical oxidation polymerization. The resultant product is subsequently cleansed with water or hot water to remove an excessive oxidizing agent, followed by repair of the dielectric oxide film 22. It is to be noted that the cleansing with water or hot water during this second solid electrolytic layer forming step is preferably performed in a manner similar to that performed during the above-described first solid electrolytic layer forming step, for example, by means of a shower cleansing method as shown in FIGS. 2, 5, and 6, or an ultrasonic cleansing method. After the repair of the dielectric oxide film 22, the resultant product is again cleansed with water or hot water and then dried. In this way, the second solid electrolytic layer (not shown) made of polypyrrole is formed over the first solid electrolytic layer 23A on the anode element 20.

During the second solid electrolytic layer forming step described above, the different concentration of the pyrrole monomer solution from that used during the first solid electrolytic layer forming step is employed. However, this embodiment may not be limited thereto, provided that the second solid electrolytic layer forming step is carried out under a condition different from that of the first solid electrolytic layer forming step. By way of example, the temperature of the oxide solution employed during the second solid electrolytic layer forming step may be lower than that during the first solid electrolytic layer forming step to eventually form the second solid electrolytic layer.

The use of the condition of the second solid electrolytic layer forming step that is different from that of the first solid electrolytic layer forming step to thereby form the second solid electrolytic layer is effective to suppress a chemical oxidation polymerization taking place during the second solid electrolytic layer forming step. Accordingly, it is possible to uniformly form the solid electrolytic layer made of an electroconductive polymer to inside the micropores of the anode element and, therefore, the solid electrolytic capacitor of an enhanced high performance can be manufactured.

Ninth Embodiment

The capacitor making method according to the ninth embodiment of the present invention differs from that according to the eighth embodiment in that the second solid electrolytic layer forming step includes a substep of dipping the anode element into a monomer solution for a predetermined time, a substep of subsequently dipping the anode element into an oxide solution for a predetermined time and a substep of holding the anode element, removed from the solution, in the air for a predetermined time. The subsequence of those substeps is carried out at least one time. According to the ninth embodiment, the solid electrolytic capacitor of an enhanced high performance can be manufactured.

The capacitor making method according to the ninth embodiment will now be described. As is the case with the eighth embodiment of the present invention, during the second solid electrolytic layer forming step, the monomer solution is uniformly dispersed over the anode element 20 having the first solid electrolytic layer 23A, which element 20 is subsequently contacted with the oxide solution to effect a chemical oxidation polymerization to form the polypyrrole film on the surface of the first solid electrolytic layer 23A. Then, after the anode element 20 has been removed from the oxide solution, the anode element 20 is held in the air for the predetermined time.

According to the ninth embodiment, after having been sequentially dipped into the monomer solution and the oxide solution, the anode element 20 removed from the oxide solution is held in the air for the predetermined time so that even within the micropores 20P of the anode element 20, the chemical oxidation polymerization can take place. If the temperature at the time the anode element 20 is held in the air is chosen to be equal to or higher than that of the oxide solution, the chemical oxidation polymerization can be advantageously accelerated.

Thereafter, the resultant product is subsequently cleansed with water or hot water to remove an excessive oxidizing agent from the polypyrrole film, followed by repair of the dielectric oxide film 22. After the repair of the dielectric oxide film 22, the resultant product is again cleansed with water or hot water and then dried. The sequence of those substeps may be repeated to provide the uniform solid electrolytic layers.

Tenth Embodiment

The capacitor making method according to the tenth embodiment of the present invention differs from that according to the first embodiment in that after the first solid electrolytic layer forming step to form the first solid electrolytic layer made of a first electroconductive polymer, the second electrolytic layer forming step to form the second solid electrolytic layer made of the first electroconductive polymer is carried out under a condition different from that for the first solid electrolytic layer forming step and in that a third solid electrolytic layer forming step to form a third solid electrolytic layer made of a second electroconductive polymer different from the first electroconductive polymer is employed subsequent to the second solid electrolytic layer forming step. According to the tenth embodiment of the present invention, it is possible to manufacture the solid electrolytic capacitors of an enhanced high performance.

Figure 8:
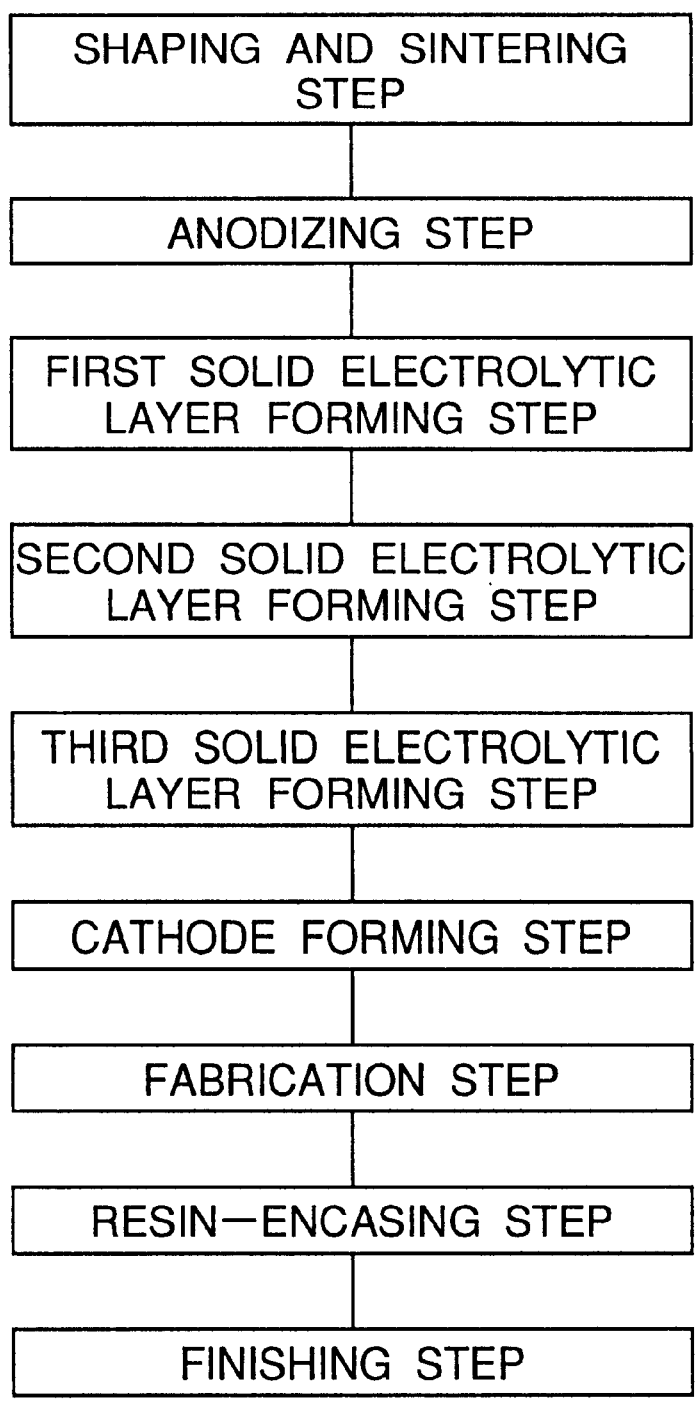
FIG. 8 is a flowchart showing the sequence of manufacture of the solid electrolytic capacitor according to a tenth embodiment of the present invention.

The capacitor making method according to this tenth embodiment of the present invention will now be described with reference to the flowchart shown in FIG. 8. The capacitor making method according to this embodiment is substantially similar to that according to the first embodiment except that as shown in FIG. 8 first, second and third solid electrolytic layer forming steps are employed. During the third solid electrolytic layer forming step, the third solid electrolytic layer made of an electroconductive polymer dissimilar to that used during the first solid electrolytic layer forming step is formed.

More specifically, as discussed in connection with the first embodiment, during the first solid electrolytic layer forming step, the anode element 20 having the dielectric oxide film 22 formed thereon and having its surface subsequently dispersed uniformly with the pyrrole monomer solution is contacted with the oxide solution to initiate the chemical oxidation polymerization to thereby form an anodized film 22. Alternatively, after the oxidizing agent has been dispersed uniformly over the surface of the anode element 20, it may be contacted with the pyrrole monomer solution to initiate the chemical oxidation polymerization.

Thereafter, the resultant product is cleansed with water or hot water to remove an excessive oxidizing agent from the polymerized film (polypyrrole film), followed by drying of the polymerized film with the residues having been removed therefrom. In this way, the first solid electrolytic layer 23A made of polypyrrole is formed over the dielectric oxide film 22 of the anode element 20. It is to be noted that repair of the dielectric oxide film 22 may be carried out before the residues present on the polymerized film is cleansed.

Then, as discussed in connection with the eighth embodiment, during the second solid electrolytic layer forming step, after the pyrrole monomer solution has been uniformly dispersed over the first solid electrolytic layer 23A formed as a result of the first solid electrolytic layer forming step, the resultant product is contacted with the oxide solution to form the polymerized film of pyrrole by means of the chemical oxidation polymerization. The resultant produce is subsequently cleansed with water or hot water to remove the excessive oxidizing agent, the dielectric oxide film 22 is then repaired and finally the resultant product is again cleansed with water or hot water before it is dried. In this way, the second solid electrolytic layer (not shown) made of polypyrrole is formed over the first solid electrolytic layer 23A of the anode element 20. It is, however, to be noted that the second solid electrolytic layer forming step is carried out under a condition (e.g., using different solution concentrations and/or temperatures) different from that of the first solid electrolytic layer forming step.

Thereafter, the third solid electrolytic layer forming step is performed. For this purpose, a suspension is prepared by dissolving in an aqueous solution of 10 wt % ethylene glycol, 1.0 mol/l of ethylene dioxythiophene 0.75 mol/l of iron(II) p-toluenesulfonic acid as an oxidizing agent and 0.15 mol/l of sodium alkylnaphthalenesulfonate as a dopant. The anode element 20 having the second solid electrolytic layer formed during the second solid electrolytic layer forming step is dipped into the suspension for a predetermined time. The anode element 20 after having been removed from the suspension is held for a predetermined time. Thereafter, the anode element 20 is cleansed with water or hot water to remove the excessive suspension and others from the second solid electrolytic layer, the dielectric oxide film 22 is then repaired and the anode element 20 is again cleansed with water or hot water before it is dried. In this way, the third electrolytic layer made of polythiophene is formed over the surface of the second solid electrolytic layer of the anode element 20. It is to be noted that the cleansing with water or hot water during the second and third solid electrolytic layer forming steps is preferably performed in a manner similar to that performed during the above-described first solid electrolytic layer forming step, for example, by means of a shower cleansing method as shown in FIGS. 2, 5, and 6, or an ultrasonic cleansing method.

The formation of the third solid electrolytic layer made of the second electroconductive polymer (e.g., polythiophene) that is dissimilar to the first electroconductive polymer (e.g., polypyrrole) forming the first and second electrolytic layers makes it possible to provide the solid electrolytic capacitor of a high performance.

In addition, since the third solid electrolytic layer is formed on the second solid electrolytic layer by the use of a suspension containing polymer particles during the third solid electrolytic layer forming step, these particles are deposited on the second solid electrolytic layer, thereby rendering the surface of the second solid electrolytic layer to be rough. This in turn results in increase of the surface area of the solid electrolytic layer and therefore, the contact resistance between the solid electrolytic layer and the carbon layer, which is formed on the solid electrolytic layers, decreases. As a result, it is possible to manufacture the solid electrolytic capacitors of a reduced ESR.

Eleventh Embodiment

The capacitor making method according to the eleventh embodiment of the present invention differs from that according to the tenth embodiment in that the third solid electrolytic layer forming step includes a substep of dipping the anode element into a suspension containing a monomer, an oxidizing agent and electroconductive polymer particles and a substep of holding the anode element, removed from the solution, outside the solution for a predetermined time, and the sequence of those substeps is repeated. According to the eleventh embodiment, the solid electrolytic capacitor of an increased high performance can be manufactured.

In the practice of the capacitor making method according to the eleventh embodiment, during the third solid electrolytic layer forming step discussed in connection with the previous tenth embodiment, the anode element 20 having the second solid electrolytic layer formed thereon is dipped in the suspension for a predetermined time and is, after having been removed from the suspension, held for a predetermined time. Thereafter, the anode element 20 is cleansed with water or hot water to remove the excessive suspension therefrom. The dielectric oxide film 22 is subsequently repaired by means of anodization, the cleansing with water or hot water is again carried out and finally the anode element is dried. This sequence of the substeps is repeated a number of time to provide the third solid electrolytic layer made of polythiophene.

Twelfth Embodiment

The capacitor making method according to the twelfth embodiment of the present invention differs from that according to the first embodiment in that after the formation of the first solid electrolytic layer made of the first electroconductive polymer, the second solid electrolytic layer made of the first electroconductive polymer is formed under a condition different from that during the first solid electrolytic layer forming step and, after the first solid electrolytic layer forming step to form the first solid electrolytic layer made of the first electroconductive polymer has again been carried out, the third solid electrolytic layer made of the second electroconductive polymer dissimilar to the first electroconductive polymer is formed. According to the twelfth embodiment, the solid electrolytic capacitor of a high performance can be manufactured.

Figure 9:
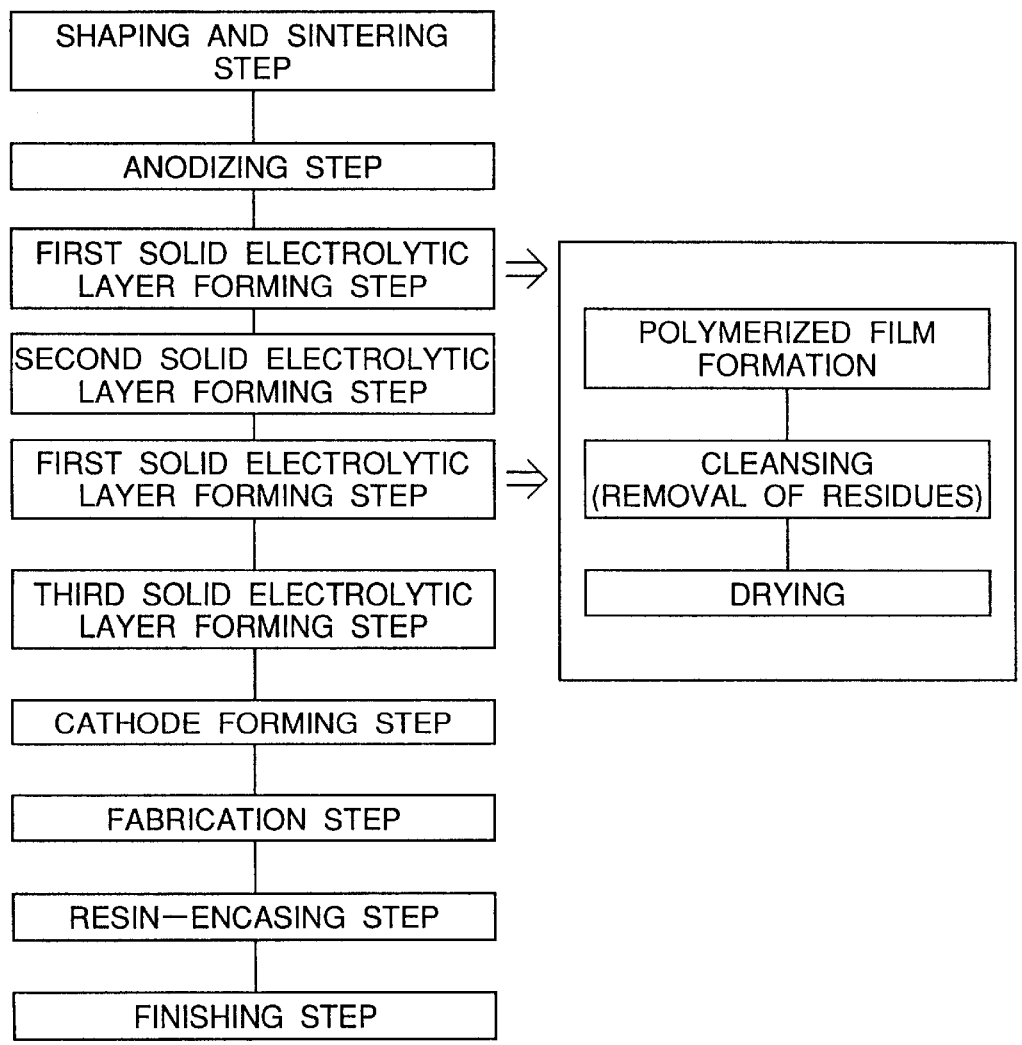
FIG. 9 is a flowchart showing the sequence of manufacture of the solid electrolytic capacitor according to a twelfth embodiment of the present invention.

More specifically, referring to FIG. 9 showing the flowchart of sequence of making the solid electrolytic capacitor according to the twelfth embodiment, the first solid electrolytic layer forming step is shown as additionally carried out intermediate between the second solid electrolytic layer forming step and the third solid electrolytic layer forming step according to the tenth embodiment shown in FIG. 8. The first solid electrolytic layer forming step intermediate between the second solid electrolytic layer forming step and the third solid electrolytic layer forming step is carried out in a manner similar to the first solid electrolytic layer forming step discussed in connection with, for example, the first embodiment of the present invention.

In this embodiment, at first, during the first solid electrolytic layer forming step, the first solid electrolytic layer is formed on the outer surface of the anode element 20 (surface region of the anode element 20 except for the micropores 20P) and a region of micropores 20P near the outer surface of the anode element 20. Then, during the second solid electrolytic layer forming step, the second solid electrolytic layer is formed deep within the micropores 20P. Therefore, the micropores 20P are filled with the first and second solid electrolytic layers. In addition, since the first solid electrolytic layer forming step is performed again after the second solid electrolytic layer forming step, the first solid electrolytic layer is formed on the anode elements 20 whose micropores 20P are filled with the solid electrolytic layers. Accordingly, the third solid electrolytic layer having a sufficient thickness is uniformly formed on the anode elements 20, and therefore, the solid electrolytic capacitor of exhibiting a low leakage current and resistance to stress can be manufactured.

According to the twelfth embodiment, the first and second solid electrolytic layers made of polypyrrole which is an electroconductive polymer can be rendered uniform, making it possible to provide the solid electrolytic capacitor of an increased high performance.

Thirteenth Embodiment

According to the thirteenth embodiment of the present invention, an addition is made of a heat treatment of the anode element having the solid electrolyte layer formed thereon, which heat treatment is carried out before the cathode forming step employed in any one of the foregoing first, eighth, and tenth embodiments. The use of the heat treatment according to the thirteenth embodiment is effective to remove completely any organic matter remaining in the polymerized film and also to fix the solid electrolytic layer, thereby making it possible to provide the solid electrolyte capacitors excellent in capacitance and ESR characteristics.

The thirteenth embodiment of the present invention will be demonstrated by way of the following examples.

EXAMPLE 1

The solid electrolytic capacitor of the structure according to Example 1 was prepared in a manner similar to that described in connection with the first embodiment, except that in this example the anode element having the solid electrolytic layer made of polypyrrole was heat-treated at 250° C. prior to the cathode forming step.

EXAMPLE 2

The solid electrolytic capacitor of the structure according to Example 2 was prepared in a manner similar to that described in connection with the eighth embodiment, except that in this example the anode element having the first and second solid electrolytic layers made of polypyrrole was heat-treated at 250° C. prior to the cathode forming step.

EXAMPLE 3

The solid electrolytic capacitor of the structure according to Example 3 was prepared in a manner similar to that described in connection with the tenth embodiment, except that in this example the anode element having the first and second solid electrolytic layers made of polypyrrole and the third solid electrolytic layer made of polythiophene was heat-treated at 250° C. prior to the cathode forming step.

Comparison

The standard solid electrolytic capacitor was prepared according to the method discussed in connection with the prior art.

The solid electrolytic capacitors in Examples 1 to 3 and Comparison discussed above were tested as to the capacitance characteristic at 120 Hz and the ESR characteristic at 100 kHz. Respective results of the tests conducted are tabulated in Table 3 below.

TABLE 3

|            | Capacitance Characteristic | ESR Characteristic |
|------------|----------------------------|--------------------|
| Example 1  | 145                        | 36                 |
| Example 2  | 152                        | 29                 |
| Example 3  | 158                        | 24                 |
| Comparison | 127                        | 74                 |

As can be seen from Table 3 above, as compared with the standard capacitor in Comparison, the capacitor in each of Examples 1 to 3 has shown excellent capacitance and ESR characteristics.

Thus, it will readily be seen that if the anode element having the solid electrolytic layer or layers formed thereon is heat-treated before the cathode forming step is performed with respect to it, the organic matter remaining on the polymerized film can advantageously be removed completely and the solid electrolytic layer or layers can be completely immobilized. Accordingly, the thirteenth embodiment of the present invention is effective to provide the solid electrolyte capacitors excellent in capacitance and ESR characteristics.

It is to be noted that the temperature of heat treatment is preferably within the range of 200 to 280° C. If the temperature is lower than 200° C., no solid electrolytic layer or layers will be completely immobilized, but if it is higher than 280° C., the solid electrolytic layer or layers will decompose, failing to provide the favorable capacitance and ESR characteristics.

Fourteenth Embodiment

In the solid electrolytic capacitor prepared as will be described in detail below in accordance with the fourteenth embodiment of the present invention, the solid electrolytic layer(s) merely contains residues, left by the polymerization used to form such solid electrolytic layer, in a quantity smaller than 5 wt %. Reduction of the amount of the residues in the solid electrolytic layer as small as possible such as accomplished in the fourteenth embodiment of the present invention is effective to provide the high performance solid electrolytic capacitor excellent in volumetric capacity.

The solid electrolytic capacitor according to this fourteenth embodiment is manufactured by the method hereinbefore described in connection with any one of the first to thirteenth embodiments of the present invention, however, the weight fraction of the residues in the solid electrolytic layer or layers is smaller than 5 wt %. Specifically, the weight fraction of the residues is intended to mean that the amount of the residues relative to the total weight of the first and second solid electrolytic layers where the solid electrolytic capacitor has the first and second solid electrolytic layers such as in any one of the eighth and ninth embodiments is smaller than 5 wt %, and the amount of the residues relative to the total weight of the first to third solid electrolytic layers where the solid electrolytic capacitor has the first to third solid electrolytic layers such as in any one of the tenth to twelfth embodiments is smaller than 5 wt %.

The residues referred to above are formed of one or more of substances contained in an unpolymerized monomer solution, substances contained in an oxidizing agent solution, both of which are remaining after the polymerization reaction, and an excessive polymer which is produced more than a desired amount.

The weight of each of the substances contained in the unpolymerized monomer solution and the substances contained in the oxidizing agent solution, both contained in the residues, is measured as follows: The anode element on which the solid electrolytic layer is formed is immersed into water and the unpolymerized monomer and the oxidizing agent are extracted into water. Then the water is measured by means of an ultraviolet and visible spectrophotometer, and the weight amount of each material is obtained by analyzing peak values of an absorbance. The substances contained in the unpolymerized monomer solution remaining after the polymerization reaction includes, not only the monomers such as pyrrole and thiophene, but also a dopant. The substances contained in the oxidizing agent solution remaining after the polymerization reaction includes, not only an oxidizer such as ferric sulfate (III), but also a dopant and ethylene glycol.

The weight of the excessive polymer is measured as follows: the weight amount of the solid electrolytic layer from which the monomer and the oxidizing agent are eliminated is measured. Then, the desired weight amount is subtracted from the resultant weight amount, and the weight amount of the excessive polymer is obtained.

Figure 10:
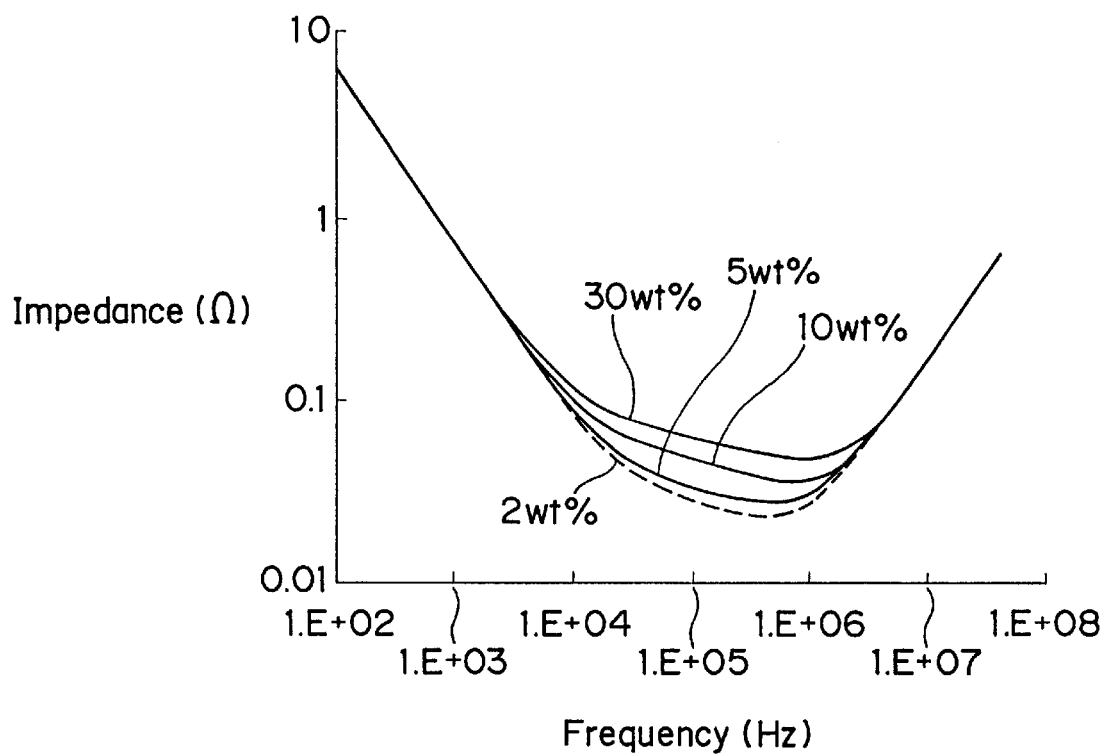
FIG. 10 a flowchart showing the sequence of manufacture of the solid electrolytic capacitor according to a fourteenth embodiment of the present invention.

FIG. 10 illustrates the chart showing results of measurement of impedance characteristics within a frequency region of $1 \times 10^2$ to $1 \times 10^8$, which were exhibited by the respective solid electrolytic capacitors when the corresponding solid electrolytic layer or layers contain the residues in a quantity of 2, 5, 10 and 30 wt %, respectively. As can readily be understood from the chart of FIG. 10, if the amount of the residue contained in the solid electrolytic layer or layers could be suppressed to a quantity smaller than 5 wt %, degradation of the ESR can be effectively and sufficiently reduced.

In the practice of the present invention, two or more of the first to thirteenth embodiments may be combined.

As discussed hereinabove, with the capacitor making method according to any one of the first to thirteenth embodiments of the present invention, removal of the residue from the solid electrolytic layer or layers, which are left by the polymerization, by a suitable means such as the shower cleansing during the solid electrolyte layer forming step makes it possible to form the uniform solid electrolytic layer or layers. Accordingly, the solid electrolytic capacitor having a high reliability can be manufactured.

The use of the second solid electrolytic layer forming substep for forming the solid electrolytic layer under a different condition before or after the first solid electrolytic layer forming substep is effective to further increase the capacitance and ESR characteristics so that the highly reliable product can be manufactured. Also, the use of the second solid electrolytic layer forming substep for forming the solid electrolytic layer under the different condition and the third solid electrolytic layer forming substep for forming the solid electrolytic layer made of the different electroconductive polymer, both after the first solid electrolytic layer forming step, is effective to further increase the capacitance and ESR characteristics so that the highly reliable product can be manufactured.

In addition, the heat-treatment of the anode element having the solid electrolytic layer or layers formed thereon, which is effected before the cathode layer forming step, makes it possible to remove completely the organic residues remaining in the polymerized film and also to immobilize the solid electrolytic layer or layers and, therefore, the solid electrolytic capacitor having the excellent capacitance and ESR characteristics can be obtained.

Fifteenth Embodiment

Figure 11:
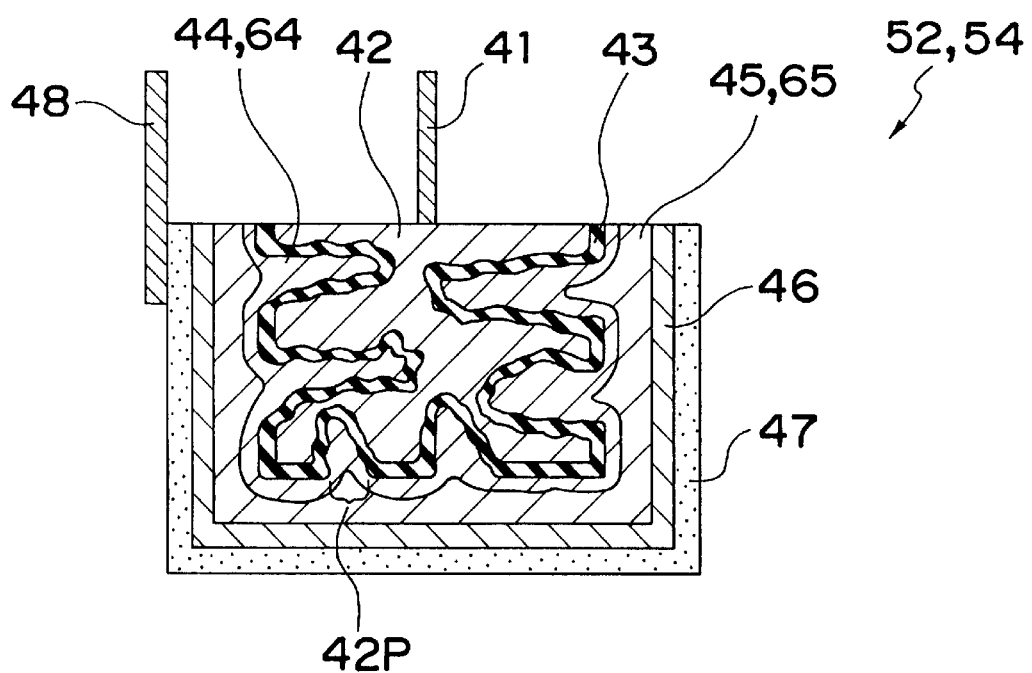
FIG. 11 is a flowchart showing the sequence of manufacture of the solid electrolytic capacitor according to a fifteenth embodiment of the present invention.

The fifteenth embodiment of the present invention will now be described with particular reference to FIG. 11 showing the solid electrolytic capacitor element 52 in section. The solid electrolytic capacitor element 52 shown therein includes a porous anode element 42, a dielectric oxide film 43, a first solid electrolytic layer 44 made of a first electroconductive polymer, a second solid electrolytic layer 45 made of a second electroconductive polymer, a carbon film 46, an electroconductive bonding layer 47, a cathode lead line 48 and an anode lead line 41. The first electroconductive polymer used to form the first solid electrolytic layer 44 and the second electroconductive polymer used to form the second solid electrolytic layer 45 may be either the same or dissimilar to each other.

The anode element 42 and the anode lead line 41 are made of a valve action metal such as, for example, tantalum, and the anode element 42 has a porosity defined by a multiplicity of micropores 42P. The anode lead line 41 is embedded in the anode element 42 with one end portion thereof extending outwardly therefrom. The anode element 42 has its surface formed with the dielectric oxide film 43 so as to cover the multiple micropores 42P in the anode element 42.

The above described solid electrolytic capacitor element 52 is resin-molded with respective portions of the anode and cathode lead lines 41 and 48 exposed to the outside of the covering resin (not shown).

The solid electrolytic capacitor according to the fifteenth embodiment of the present invention is manufactured in the following manner. At the outset, the porous anode element 42 is prepared by shaping and sintering a powder of valve action metal such as, for example, tantalum and connecting the anode lead line 41 thereto. The anode lead line 41 in the form of a tantalum wire is embedded in the anode element 42 with one end portion thereof extending outwardly therefrom. The anode element 42 is then anodized to form the dielectric oxide film 43 over the surface of the anode element 42.

The anode element 42 having the dielectric oxide film 43 formed on the surface thereof is dipped in a polymerization solution containing a heterocyclic monomer and then into an oxidizer solution of a pH value not greater than 4. A process of dipping the anode element 42 in the polymerization solution and then in the oxidizer solution is repeated a number of times so that as a result of chemical oxidation polymerization, the first solid electrolytic layer 44 made of the first electroconductive polymer can be formed on a surface of the dielectric oxide film 43.

Subsequently, the anode element 42 having the first solid electrolytic layer 44 and the dielectric oxide film 43 is dipped into a mixed solution containing a heterocyclic monomer and an oxidizing agent so that as a result of chemical oxidation polymerization, the second solid electrolytic layer 45 made of the second electroconductive polymer can be formed on a surface of the first solid electrolytic layer 44.

Thereafter, a cathode layer in the form of the carbon film 46 is formed over the second solid electrolytic layer 45, the electroconductive bonding layer 47 is formed over the carbon layer 46, and the cathode lead line 48 is finally connected to the electroconductive bonding layer 47.

Finally, the solid electrolytic capacitor element 52 is resin-molded with respective portions of the anode and cathode lead lines 41 and 48 exposed to the outside of the covering resin (not shown) to thereby complete a tantalum solid electrolytic capacitor.

In this fifteenth embodiment, since the oxidizer solution of a pH value not greater than 4 is employed to form the first solid electrolytic layer 44, and since the anode element 42 having the dielectric oxide film 43 is dipped into the polymerization solution containing the heterocyclic monomer and the oxidizer solution of pH 4 or lower to thereby form the first solid electrolytic layer 44, the chemical oxidation polymerization can be speeded up. Accordingly, when the anode element 42 having been dipped into the polymerization solution is subsequently dipped into the oxidizer solution, the chemical oxidation polymerization can be initiated before the polymerization solution dissolves into the oxidizer solution and, therefore, the first solid electrolytic layer 44 of a sufficient thickness can be formed within the micropores in the porous anode element 42. Consequently, the number of times of film forming required to form the first solid electrolytic layer 44 can advantageously be reduced.

If the oxidizer solution having a pH value greater than 4 is used, the amount of the electroconductive polymer formed by a single chemical oxidation polymerization will be small and formation of the first solid electrolytic layer having a sufficient film thickness over the dielectric oxidation film would require the chemical oxidation polymerization to be effected an increased number of times. Accordingly, the pH value of the oxidizer solution has to be not greater than 4.

The oxidizer solution of the pH value not greater than 4 is preferably in the form of an oxidizer solution containing an acid capable of dissociating strong acid ions into the solution. This enhances a chemical oxidation polymerization of the heterocyclic monomer, resulting in formation of the solid electrolytic layer made of the electroconductive polymer having a high electroconductivity.

The oxidizer solution of the pH value not greater than 4 is preferably in the form of an oxidizer solution containing an acid effective to form strong acid ion during the chemical oxidation polymerization. When the porous anode element is dipped into such an oxidizer solution, the pH value of the oxidizer solution decreases exponentially within the micropores of the anode element, and correspondingly, the chemical polymerization can be acceleratedly facilitated to further facilitate formation of the solid electrolytic layer.

Addition of the acid to the oxidizer solution is effective to increase the compatibility of the oxidizer solution and, therefore, neither precipitation nor separation of solutes will virtually occur even at a low temperature, so that the reaction speed affected by temperatures can easily be controlled, making it possible to form the solid electrolytic layer in a stabilized fashion.

In the solid electrolytic capacitor of the present invention, it is preferred that the first and second solid electrolyte layers 44 and 45, made of polypyrrole or polythiophene, over the dielectric oxide film with the use of the heterocyclic monomers such as, for example, pyrrole and thiophene. This is because these electroconductive polymers have a high efficiency of chemical oxidation polymerization and a high electroconductivity. It is, however, to be noted that the solid electrolytic capacitor in the embodiment now under discussion is not limited to the above described solid electrolytic capacitor 52, and if the first solid electrolytic layer 44 is formed by the use of the oxidizer solution having the pH value not greater than 4, effects similar to those described above can be obtained even without, for example, the second solid electrolytic layer 45 being formed over the first solid electrolytic layer 44.

As the heterocyclic monomer, thiophene is preferably makes use of ethylene dioxythiophene, because the polyethylene dioxythiophene has a high efficiency of chemical oxidation polymerization and a high electroconductivity.

Of the ethylene dioxythiophenes, the use of 3.4-ethylene dioxythiophene is preferred.

It is preferred that a process of dipping the anode element having the dielectric oxide film into the polymerizarion solution containing the heterocyclic monomers and then into the oxidizer solution having the pH value not greater than 4, then cleansed, anodized for repairing the dielectric oxide film and dries is carried out at least two times to form the first solid electrolytic layer electroconductive polymer layer and that a step of drying after the anode element has been dipped into the mixed solution containing the heterocyclic monomers and the oxidizing agent is carried out at least two times to form the second solid electrolytic layer, followed by anodizing for repairing the dielectric oxide film. Since the continuous solid electrolytic layer can be formed deep into the micropores of the anode element, the solid electrolytic capacitor having further excellent capacitance and ESR characteristics can be obtained.

Also, the cleansing is preferably carried out in an aqueous solution containing solutes. Since the iron concentration of the solid electrolytic layer can be suppressed to an extremely low value, the ESR characteristic of the capacitor can further be improved.

Hereinafter, the fifteenth embodiment of the present invention will be demonstrated by way of examples which are not intended to limit the scope of the present invention, but only for illustration purpose.

EXAMPLE 4

After a tantalum powder has been shaped together with lead wires, the anode element 42, 0.3×3.0×4.0 mm in size, was formed by sintering. A surface of this anode element 42 was then anodized at a voltage of 20 V with the use of a phosphoric acid solution to form the dielectric oxide film 43.

The anode element 42 having the dielectric oxide film 43 formed thereon is dipped for 5 minutes into the polymerization solution. The polymerization solution is prepared from an aqueous solution containing 10 wt % of ethylene glycol added with pyrrole as the heterocyclic monomer to a concentration of 1.0 mol/l and sodium alkylnaphthalenesulfonate as the dopant to a concentration of 0.25 mol/l.

Then, the anode element 42 removed from the polymerization solution is immediately dipped into the oxidizer solution of pH 0.5 for ten minutes. This oxidizer solution is prepared from an aqueous solution of 10 wt % of ethylene glycol added with ferric sulfate (III) as the oxidizing agent to a concentration of 0.75 mol/l.

Thereafter, the anode element 42 removed from the oxidizer solution is cleansed, repaired by anodization and dried (at 100° C.). The process of dipping, cleansing, repairing and drying is repeated five times to complete formation of the first solid electrolytic layer 44, made of the first electroconductive polymer, over the dielectric oxide film 43.

The anode element 42 having the first solid electrolytic layer 44 was dipped for five minutes into a mixed solution containing the oxidizing agent, monomer and dopant. This mixed solution is prepared from an aqueous solution of 10 wt % of ethylene glycol added with pyrrole as the heterocyclic monomer to a concentration of 1.0 mol/l, iron(II) p-toluenesulfonic acid as the oxidizing agent to a concentration of 0.75 mol/l and sodium alkylnaphthalenesulfonate as the dopant to a concentration of 0.15 mol/l. The anode element 42 after having been removed from the mixed solution was dried (at 120° C). The process of dipping and drying was repeated two times to complete formation of the second solid electrolytic layer 45 made of the second electroconductive polymer.

Thereafter, the carbon film 46 and the electroconductive bonding layer 47 were sequentially formed on the second solid electrolytic layer 45, followed by connection of the cathode lead line 48. Finally, the solid electrolytic capacitor element 52 was resin-molded with respective portions of the anode and cathode lead lines 41 and 48 exposed to the outside of the covering resin (not shown) to thereby complete a tantalum solid electrolytic capacitor (D size: 7.3× 4.3×2.8 mm).

EXAMPLE 5

Except that the concentration of the ferric sulfate (III) contained in the oxidizer solution was chosen to be 0.5 mol/l (the pH value being 1.5), the tantalum solid electrolytic capacitor was fabricated in a manner similar to that in Example 4 above.

EXAMPLE 6

Except that the concentration of the ferric sulfate (III) contained in the oxidizer solution was chosen to be 0.2 mol/l (the pH value being 3.4), the tantalum solid electrolytic capacitor was fabricated in a manner similar to that in Example 4 above.

EXAMPLE 7

Except that the concentration of the ferric sulfate (III) contained in the oxidizer solution was chosen to be 0.15 mol/l (the pH value being 4.2), the tantalum solid electrolytic capacitor was fabricated in a manner similar to that in Example 4 above.

EXAMPLE 8

Except that in place of the ferric sulfate (III) ammonium peroxodisulphate added with sulfuric acid was employed in the oxidizer solution (the sulfuric acid was added to adjust the pH value of the oxidizer solution to 1.0), the tantalum solid electrolytic capacitor was fabricated in a manner similar to that in Example 4 above.

EXAMPLE 9

Except that pyrrole ethylene dioxythiophene was employed as the heterocyclic monomer, the tantalum solid electrolytic capacitor was fabricated in a manner similar to that in Example 4 above.

EXAMPLE 10

The solid electrolytic capacitor in this Example 10 was fabricated in a manner similar to that in Example 4, except that the first and second solid electrolytic layers 44 and 45 in Example 10 were formed in a manner which will now be described.

The polymerization solution was prepared from an aqueous solution containing 10 wt % of ethylene glycol added with pyrrole as the heterocyclic monomer to a concentration of 1.0 mol/l and sodium alkylnaphthalenesulfonate as the dopant to a concentration of 0.25 mol/l. The anode element 42 having the dielectric oxide film 43 was dipped for five minutes into this polymerization solution, removed from the polymerization solution and immediately dipped for ten minutes into the oxidizer solution (pH 1.0) of 10 wt % of ethylene glycol added with ferric sulfate (III) as the oxidizing agent to a concentration of 0.5 mol/l. Thereafter, the anode element 42 removed from the oxidizer solution is cleansed with a aqueous solution of citric acid, repaired by anodization and dried (at 100° C.). The process of dipping, cleansing, repairing and drying is repeated three times to complete formation of the first solid electrolytic layer 44 made of the first electroconductive polymer.

The anode element 42 having the first solid electrolytic layer 44 was dipped for five minutes into a mixed solution. This mixed solution was prepared from an aqueous solution of 10 wt % of ethylene glycol added with ethylene dioxythiophene as the heterocyclic monomer to a concentration of 1.0 mol/l, iron(II) p-toluenensulfonic acid as the oxidizing agent to a concentration of 0.75 mol/l and sodium alkyl-naphthalenesulfonate as the dopant to a concentration of 0.15 mol/l. The anode element 42 after having been removed from the mixed solution was dried (at 120° C.). After the process of dipping and drying had been repeated two times, cleansing, repairing by anodization and drying (at 100° C.) were sequentially performed to complete formation of the second solid electrolytic layer 45, made of the second electroconductive polymer, over the first solid electrolytic layer 44.

Comparison 2

The solid electrolytic capacitor in this Comparison 2 was fabricated in a manner similar to that in Example 4, except that the solid electrolytic layer in Comparison 2 was formed in a manner which will now be described.

The polymerization solution was prepared from an aqueous solution containing 10 wt % of ethylene glycol added with pyrrole as the heterocyclic monomer to a concentration of 1.0 mol/l and sodium alkylnaphthalenesulfonate as the dopant to a concentration of 0.25 mol/l. The anode element having the dielectric oxide film was dipped for five minutes into this polymerization solution. The anode element after having been removed from the polymerization solution was immediately dipped for ten minutes into the oxidizer solution (pH 5.0) of 10 wt % of ethylene glycol added with iron(II) p-toluenensulfonic acid as the oxidizing agent to a concentration of 0.5 mol/l. Thereafter, the anode element removed from the oxidizer solution is cleansed with water, repaired by anodization and dried (at 100° C). The process of this sequence was repeated 15 times to complete formation of the solid electrolytic layer over the dielectric oxide film.

Comparison 3

The solid electrolytic capacitor in this Comparison 3 was fabricated in a manner similar to that in Example 4, except that the solid electrolytic layer in Comparison 2 was formed in a manner which will now be described.

The mixed solution was prepared from an aqueous solution of 10 wt % of ethylene glycol added with thiophene as the heterocyclic monomer to a concentration of 1.0 mol/l, iron(II) p-toluenensulfonic acid as the oxidizing agent to a concentration of 0.5 mol/l and sodium alkylnaphthalene-sulfonate as the dopant to a concentration of 0.15 mol/l (pH 6.6 as the oxidizer solution). The anode element having the dielectric film was dipped for five minutes into this mixed solution and was, after having been removed from the mixed solution, dried (at 120° C.). The process of dipping and drying was repeated 15 times and the anode element was then cleansed, anodized for repairing the dielectric oxide film, and dried (at 100° C.) to thereby complete formation of the solid electrolytic layer.

The tantalum solid electrolytic capacitors according to Examples 4 to 10 and Comparisons 2 and 3 were tested as to the capacitance characteristic at 120 Hz, the impedance characteristic at 100 kHz and the leakage current (the value measured 30 seconds after rated voltage application). Respective results of the tests conducted are tabulated in Table 4 below.

TABLE 4

|  | pH Value of Oxidizer solution | Capacitance Characteristic ($\mu F$) | ESR Characteristic (100 kHz) | Leak Current ($\mu A$, 30 s) |
| --- | --- | --- | --- | --- |
| Example 4 | 0.15 | 150 | 25 | 10 |
| Example 5 | 1.5 | 144 | 28 | 12 |
| Example 6 | 3.4 | 138 | 30 | 15 |
| Example 7 | 4.2 | 130 | 35 | 20 |
| Example 8 | 1.0 | 152 | 23 | 9 |
| Example 9 | 0.5 | 154 | 22 | 8 |
| Example 10 | 1.0 | 158 | 20 | 5 |
| Comp. 2 | 5.0 | 125 | 70 | 100 |
| Comp. 3 | 6.6 | 110 | 95 | 120 |

As can be understood from Table 4 above, the tantalum solid electrolytic capacitor according to any one of Examples 4 to 10 has shown excellent properties in all aspects of the capacitance characteristic, the ESR characteristic and the leakage current characteristic as compared with that according to any one of Comparisons 2 and 3. In particular, in the tantalum solid electrolytic capacitor in any one of Examples 4 to 10, since the film thickness of the solid electrolytic layer formed on the dielectric oxide film within the micropores of the anode element progressively decreases with increase of the pH value of the oxidizer solution, the capacitance, ESR and leakage current characteristics tend to be degraded, but are superior to those exhibited by the capacitor of any one of Comparisons 2 and 3. However, the use of the oxidizer solution having the pH value in excess of 4 appears to result in degradation of the capacitance, ESR and leakage current characteristics of the capacitor, approximating to those exhibited by Comparisons 2 and 3 and, therefore, the pH value is preferred to be not greater than 4.

When as is the case with Example 8 the solid electrolytic capacitor is prepared with the use as the oxidizer solution of the ammonium peroxodisulphate tending to produce strong acid ions during the chemical oxidation polymerization, or even when as is the case with Example 9, the solid electrolytic capacitor is prepared with the use of thiophene and pyrrole as the heterocyclic monomer, the excellent capacitance, ESR and leakage current characteristics as compared with those exhibited by the capacitor in any one of Comparisons 2 and 3 could be obtained.

Also, when as is the case with Example 10, a substep of cleansing the anode element in an aqueous solution added with the electrolyte is employed after the chemical oxidation polymerization at the time the first solid electrolytic layer made of the first electroconductive polymer is formed, the capacitor capable of exhibiting the further excellent capacitance, ESR and leakage current characteristics can be manufactured.

On the other hand, the tantalum solid electrolytic capacitor according to any one of Comparison 2 and 3 could not exhibit better capacitance, ESR and leakage current characteristics than those in any one of Examples 4 to 10 even though the chemical oxidation polymerization was performed 15 times. In particular, the use of iron(II) p-toluenensulfonic acid as the oxidizing agent resulted in extremely worse characteristics.

As discussed above, with the capacitor making method according to the fifteenth embodiment of the present invention, since the dielectric oxide film is formed on the porous anode element made of a valve action metal, the first solid electrolytic layer is then formed on the surface of the anode element by dipping into the polymerization solution, containing the heterocyclic monomer, and then into the oxidizer solution of a pH value not greater than 4 to effect the chemical oxidation polymerization, and the second solid electrolytic layer is formed by dipping into the mixed solution, containing the heterocyclic monomer and the oxidizing agent, to effect the chemical oxidation polymerization, the film thickness of the solid electrolytic layer formed within the micropores of the anode element can be increased. Accordingly, not only can the number of times over which the chemical oxidation polymerization is effected to form the solid electrolytic layer be reduced, accompanied by increase of the productivity, but also the solid electrolytic capacitor capable of exhibiting the excellent capacitance and ESR characteristics can be obtained.

Sixteenth Embodiment

The sixteenth embodiment of the present invention will now be described with reference to FIG. 11. It is, however, to be noted that the solid electrolytic capacitor 54 according to the sixteenth embodiment of the present invention differs from the solid electrolytic capacitor 52 according to the previously described fifteenth embodiment in that the capacitor 54 includes the solid electrolytic layers 64 and 65 made of an electroconductive polymer having an iron concentration not greater than 100 ppm. According to this embodiment, when the solid electrolytic layer of the solid electrolytic capacitor 54 is made of the electroconductive polymer having an iron concentration not greater than 100 ppm, the leakage current can be reduced to thereby reduce the possibility of shortcircuit. Accordingly, the solid electrolytic capacity can be manufactured at a high yield.

It is to be noted that the solid electrolytic capacitor 54 shown in FIG. 11 has the first and second solid electrolytic layers 64 and 65 made of the electroconductive polymer and that the iron concentration of the solid electrolytic layer referred to above means the iron concentration of the whole of the first and second solid electrolytic layers 64 and 65 taken collectively. It is also to be noted that the solid electrolytic capacitor according to this sixteenth embodiment may not be limited to that in which the two solid electrolytic layers, that is, the first and second solid electrolytic layers 64 and 65 are formed such as shown in FIG. 11, but may have only one solid electrolytic layer 64 provided that it is made of the electroconductive polymer having an iron concentration not greater than 100 ppm. In addition, where the solid electrolytic capacitor 54 has the first and second solid electrolytic layers 64 and 65, the first and second solid electrolytic layers 64 and 65 may be made of the same electroconductive polymer or the different electroconductive polymers.

In the solid electrolytic capacitor 54 according to this embodiment, the first and second solid electrolytic layers 64 and 65 having an iron concentration not greater than 100 ppm can be formed by performing the cleansing after the chemical oxidation polymerization. This is because by this cleansing, the iron concentration of the solid electrolytic layer made of the electroconductive polymer formed as a result of the chemical oxidation polymerization can be reduced.

The solid electrolytic layers 64 and 65 made of the electroconductive polymer are preferably formed by causing the heterocyclic monomer to undergo the chemical oxidation polymerization with the use of the use of the oxidizing agent in the form of organic and/or inorganic ferric salt. By so doing, the electroconductive polymer capable of exhibiting a high efficiency of chemical oxidation polymerization and a high electroconductivity can be obtained.

The solid electrolytic capacitor 54 according to this embodiment can be prepared in the following manner.

The solid electrolytic capacitor 54 according to this sixteenth embodiment is prepared in the following manner.

The anode element 42 made of a metal having a valve action is first anodized, followed by formation of the dielectric oxide film 43 on a surface of the anode element 42. The anode element 42 is subsequently dipped into the polymerization solution containing the heterocyclic monomer and then into the oxidizer solution containing the oxidizing agent in the form of inorganic ferric salt, and cleansed to complete the first solid electrolytic layer 64 over the dielectric oxide film 43.

Thereafter, the anode element 42 having the dielectric oxide film 43 and the first solid electrolytic layer 64 is dipped into the mixed solution containing the heterocyclic monomer and the oxidizing agent in the form of organic ferric salt, and cleansed to complete formation of the second solid electrolytic layer 65 over the first sole electrolytic layer 64.

With the capacitor making method according to the sixteenth embodiment, since the anode element impregnated with the reaction solution is cleansed at the time the first and second solid electrolytic layers 64 are individually formed, the resultant solid electrolytic layer can have an iron concentration not greater than 100 ppm. Since accordingly the leakage current of the resultant solid electrolytic capacitor can be lowered, the number of the capacitors susceptible to shortcircuit can be reduced to enable the solid electrolytic capacitors to be manufactured at a high yield.

Preferably, to form the first solid electrolytic layer 64, made of the electroconductive polymer, over the dielectric oxide film 43, a process of dipping the anode element 42 having the dielectric oxide film 43 into the polymerization solution containing the heterocyclic monomer and then into the oxidizer solution containing the oxidizing agent in the form of the inorganic ferric salt, cleansing and repairing is carried out at least two times. Similarly, to form the second solid electrolytic layer 65, made of the electroconductive polymer, over the first solid electrolytic layer 64, a process of dipping the anode element 42 having the first solid electrolytic layer 64 into the mixed solution containing the heterocyclic monomer and the oxidizing agent in the form of the organic ferric salt is preferably carried out at least two times, followed by cleansing. If the solid electrolytic capacitor is prepared in this way, the first and second solid electrolytic layers each made of the respective electroconductive polymer can be densely formed over the dielectric oxide film generally free from defects and the iron concentration remaining in the first and second solid electrolytic layers can be reduced, making it possible to reduce the leakage current and also to reduce the number of shortcircuiting detects.

The cleansing effected during the formation of each of the first and second solid electrolytic layers 64 and 65 may be carried out with the use of either water or hot water. Although the order of use is not limited, the hot water cleansing is preferably performed the first thing since the iron content can further be reduced. Moreover, the cleansing may be carried out in a manner similar to that described in connection with the second, sixth, and seventh embodiments.

Also, The cleansing effected during the formation of each of the first and second solid electrolytic layers 64 and 65 may be carried out by immersing the anode element 42 into a solution containing an electrolyte. Alternatively, the cleansing may be carried out by applying a voltage with the anode element 42 used as an anode while the anode element 42 is immersed in the solution containing the electrolyte. This is particularly advantageous in that by the action of the electrolyte iron contained in the solid electrolytic layer can be maintained in the form of iron ions and, therefore, the iron concentration of the solid electrolytic layer can be reduced. Also, if a voltage is applied with the anode element used as an anode, iron ions having a positive charge receive a repellent force from the anode element 42 and, therefore, the iron concentration can further be reduced from the respective solid electrolytic layer.

The solution containing the electrolyte that is used during the cleansing is preferably prepared from organic acids and their salts and molecules having concurrently a hydroxyl group and a carboxyl group. By the action of the hydroxyl and carboxyl groups in the molecules, the iron ions become a complex and, since the complex is stable in the solution, reduction of the iron concentration from the solid electrolytic layer can be facilitated and, hence, the iron concentration in the solid electrolytic layer can be reduced.

It is to be noted that the electrolyte preferably has a molecular structure in which the hydroxyl group and the carboxyl group coexist. The use of the electrolyte lacking one or both of the hydroxyl and carboxyl groups will result in difficulty in forming the iron ions and the complex and, therefore, the effect will be considerably reduced.

The electrolyte referred to above may be employed in the form of a citric acid, tartaric acid, gluconic acid or the like.

Where the cleansing effected during the formation of the solid electrolytic layer is carried out while the voltage is applied, it is preferred that the anode element 42 is used as an anode and a voltage applied is of a value which is 0.2 to 1 times the anodizing voltage of the dielectric oxide film. Since application of the voltage to the anode element results in formation of an electric field with the iron ions of positive charge consequently receiving a repellent force, the iron ions can easily be removed from the electroconductive polymer. As a result, the iron concentration in the solid electrolytic layer decreases and a current concentration is relieved, resulting in lowering of the leakage current and reduction of the number of shortcircuiting defects, wherefore the solid electrolytic capacitors can be manufactured at a high yield.

If the voltage applied to the anode element is of a value not higher than 0.2 times the anodizing voltage of the dielectric oxide film, no sufficient repellent force required to reduce the iron concentration from the solid electrolytic layer cannot be secured. On the other hand, if it is higher than one times the anodizing voltage of the dielectric oxide film, the iron ions will be captured into the dielectric oxide film, resulting in increase of the leakage current. Accordingly, the voltage to be applied to the anode element 42 has to be within the range of 0.2 to 1 times the anodizing voltage of the dielectric oxide film.

Hereinafter, the sixteenth embodiment of the present invention will be demonstrated by way of non-limiting examples, wherein a term "part" used in connection with the quantity represents a "part by weight".

EXAMPLE 11

A tantalum metal powder having the anode lead line in the form of a tantalum wire embedded therein with one end portion thereof extending outside was shaped and sintered to form the porous anode element 42, followed by formation of the dielectric oxide film 43 on the surface of the anode element 42 by means of anodization.

The anode element 42 having the dielectric oxide film 43 formed thereon was dipped into the solution containing 1 part of pyrrole, which is a heterocyclic monomer, and 4 part of 1-propanol which is a polymerizing solvent, and is then removed out of the solution. Thereafter, the anode element 42 was after having been dipped into the solution containing 2 parts of ferric acid, which is an oxidizing agent, and 4 parts of 1-propanol, which is a solvent, removed out of the solution, then cleansed in an aqueous solution of 1.0% citric acid at 85° C., and finally dried to form the first solid electrolytic layer 64 over the anodized oxide film 43.

The anode element having the first solid electrolytic layer 64 formed in the manner described above was, after having been dipped into the mixed solution containing 1 part of pyrrole, which is a heterocyclic monomer, 2 parts of iron(II) p-toluenensulfonic acid, which is an oxidizing agent, and 4 parts of 1-propanol, which is a polymerizing solvent, and then removed out of the mixed solution, cleansed in an aqueous solution of 1.0% citric acid at 85° C., and finally dried to form the second solid electrolytic layer 65. The iron concentration in the first and second solid electrolytic layers as a whole was 85 ppm.

Thereafter, the cathode layer 46 and the electroconductive bonding layer 47 were sequentially formed over the second solid electrolytic layer 65 and the cathode lead line 48 was finally connected. Finally, the solid electrolytic capacitor 54 is resin-molded with respective portions of the anode and cathode lead lines 41 and 48 exposed to the outside of the covering resin (not shown) to thereby complete a tantalum solid electrolytic capacitor (D size: 7.3×4.3×2.8 mm).

EXAMPLE 12

The solid electrolytic capacitor in this Example 12 was fabricated in a manner similar to that in Example 11, except that the first and second solid electrolytic layers in Example 12 were formed in a manner which will now be described.

The anode element 42 having the dielectric oxide film 43 was dipped into and removed out of a solution containing 1 part of pyrrole, which is a heterocyclic monomer, and 4 parts of 1-propanol which is a polymerizing solvent. Subsequently, the anode element 42 was dipped into and removed out of a solution containing 2 part of ferric acid, which is an oxidizing agent, and 4 parts of 1-propanol, which is a solvent, then cleansed in an aqueous solution of 1.0% tartaric acid at 85° C. and finally dried to complete formation of the first solid electrolytic layer 64 over the dielectric oxide film.

Thereafter, in order to repair the dielectric oxide film 43, anodization was carried out, followed by cleansing with water and drying.

After the anode element 42 had been dipped into and removed out of the mixed solution containing 1 part of pyrrole, which is a heterocyclic monomer, 2 parts of iron(II) p-toluenensulfonic acid, which is an oxidizing agent, and 4 parts of 1-propanol, which is a polymerizing solvent, the anode element 42 was cleansed in an aqueous solution of 1.0% citric acid at 85° C., and finally dried to complete formation of the second solid electrolytic layer 65 over the first solid electrolytic layer 64. The iron concentration in the first and second solid electrolytic layers as a whole was 75 ppm.

EXAMPLE 13

The solid electrolytic capacitor in this Example 13 was fabricated in a manner similar to that in Example 11, except that the first and second solid electrolytic layers in Example 13 were formed in a manner which will now be described.

The anode element 42 having the dielectric oxide film 43 was dipped into and removed out of a solution containing 1 part of pyrrole, which is a heterocyclic monomer, and 4 parts of 1-propanol which is a polymerizing solvent. Subsequently, the anode element 42 was dipped into and removed out of a solution containing 2 part of ferric acid, which is an oxidizing agent, and 4 parts of 1-propanol, which is a solvent, then cleansed in an aqueous solution of 1.0% tartaric acid at 85° C. and finally dried, which was followed by chemical repairing formation and drying. This sequence was repeated five times to complete formation of the first solid electrolytic layer 64 over the dielectric oxide film.

After the anode element 42 had been subsequently dipped into and removed out of the mixed solution containing 1 part of pyrrole, which is a heterocyclic monomer, 2 parts of iron(II) p-toluenensulfonic acid, which is an oxidizing agent, and 4 parts of 1-propanol, which is a polymerizing solvent, a process of drying and, again dipping into the mixed solution and drying was repeated three times. Then, the anode element 42 was cleansed in a solution of 1.0% citric acid at 85° C., and finally dried to complete formation of the second solid electrolytic layer 65 over the first solid electrolytic layer 64. The iron concentration in the first and second solid electrolytic layers as a whole was 55 ppm.

EXAMPLE 14

Except that the voltage of a value 0.1 times the anodizing voltage of the dielectric oxide film 43 was applied while the anode element 42 was immersed in the citric acid solution for cleansing, the tantalum solid electrolytic capacitor in Example 14 was fabricated in a manner similar to that in Example 11 above. The iron concentration in the first and second solid electrolytic layers 64 and 65 as a whole was 82 ppm.

EXAMPLE 15

Except that the voltage of a value 0.2 times the anodizing voltage of the dielectric oxide film 43 was applied while the anode element 42 was immersed in the citric acid solution for cleansing, the tantalum solid electrolytic capacitor in Example 15 was fabricated in a manner similar to that in Example 11 above. The iron concentration in the first and second solid electrolytic layers 64 and 65 as a whole was 70 ppm.

EXAMPLE 16

Except that the voltage of a value 1 times the anodizing voltage of the dielectric oxide film 43 was applied while the anode element 42 was immersed in the citric acid solution for cleansing, the tantalum solid electrolytic capacitor in Example 16 was fabricated in a manner similar to that in Example 11 above. The iron concentration in the first and second solid electrolytic layers 64 and 65 as a whole was 65 ppm.

EXAMPLE 17

Except that the voltage of a value 1.1 times the anodizing voltage of the dielectric oxide film 43 was applied while the anode element 42 was immersed in the citric acid solution for cleansing, the tantalum solid electrolytic capacitor in Example 17 was fabricated in a manner similar to that in Example 11 above. The iron concentration in the first and second solid electrolytic layers 64 and 65 as a whole was 90 ppm.

EXAMPLE 18

Except that the anode element 20 was cleansed by immersing it in the citric acid solution at 70° C. for 30 minutes, the tantalum solid electrolytic capacitor in Example 18 was fabricated in a manner similar to that in Example 11 above. The iron concentration in the first and second solid electrolytic layers 64 and 65 as a whole was 95 ppm.

EXAMPLE 19

Except that the anode element 20 was cleansed by immersing it in the citric acid solution at 70° C. for 20 minutes, the tantalum solid electrolytic capacitor in Example 19 was fabricated in a manner similar to that in Example 11 above. The iron concentration in the first and second solid electrolytic layers 64 and 65 as a whole was 100 ppm.

Comparison 4

A tantalum metal powder having the anode lead line in the form of a tantalum wire embedded therein with one end portion thereof extending outside was shaped and sintered to form the porous anode element, followed by formation of the dielectric oxide film on the surface of the anode element by means of anodization. The anode element having the dielectric oxide film formed thereon was dipped into and removed out of the solution containing 1 part of pyrrole, which is a heterocyclic monomer, and 4 part of 1-propanol which is a polymerizing solvent. Then, after the anode element had been dipped into and removed out of the solution containing 2 parts of ferric acid, which is an oxidizing agent, and 4 parts of 1-propanol, which is a solvent, the anode element was allowed to stand for 60 minutes at 85° C., to thereby form the solid electrolytic layer, made of polypyrrole, over the anodized oxide film. The iron concentration in the solid electrolytic layer was 130 ppm.

Thereafter, the cathode layer and the electroconductive bonding layer were sequentially formed and the cathode lead line was finally connected to complete the capacitor element. Finally, this capacitor element was resin-molded with respective portions of the anode and cathode lead lines exposed to the outside to thereby complete a tantalum solid electrolytic capacitor of Comparison 4 (D size: 7.3×4.3×2.8 mm).

Comparison 5

Except that after the anode element had been dipped into and removed out of the solution containing the oxidizing agent and the solvent, the anode element was allowed to stand for 80 minutes at 85° C., to thereby form the solid electrolytic layer made of polypyrrole, the tantalum solid electrolytic capacitor in Comparison 5 was fabricated in a manner similar to that in Comparison 4 above. The iron concentration in the solid electrolytic layer was 105 ppm.

Comparison 6

Except that after the anode element had been dipped into and removed out of the solution containing the oxidizing agent and the solvent, the anode element was allowed to stand for 100 minutes at 85° C., to thereby form the solid electrolytic layer made of polypyrrole, the tantalum solid electrolytic capacitor in Comparison 5 was fabricated in a manner similar to that in Comparison 4 above. The iron concentration in the solid electrolytic layer was 110 ppm.

The tantalum solid electrolytic capacitors according to Examples 11 to 19 and Comparisons 4 to 6 were tested as to the iron concentration in the solid electrolytic layer, the leakage current (the value measured 30 seconds after rated voltage application) and the number of occurrence of short-circuit (defect) during an aging process. Respective results of the tests conducted are tabulated in Table 5 below.

It is to be noted that in conducting a series of tests, 50 capacitors according to any one of Examples 11 to 17 and Comparison 4 were tested and the iron concentration tabulates is an average value whereas the leakage current is an average value taken from some of the capacitors which survived without accompanied by shortcircuit.

TABLE 5

|  | Iron Concentration (ppm) | Leak Current ($\mu$A, 30 s) | Nos. of Short-circuits Occurred |
|---|---|---|---|
| Example 11 | 85 | 1.5 | 0 |
| Example 12 | 75 | 1.3 | 0 |
| Example 13 | 55 | 0.7 | 0 |
| Example 14 | 82 | 1.4 | 0 |
| Example 15 | 70 | 1.2 | 0 |
| Example 16 | 65 | 1.1 | 0 |
| Example 17 | 90 | 1.7 | 1 |
| Example 18 | 95 | 1.8 | 1 |
| Example 19 | 100 | 1.9 | 1 |
| Comp. 4 | 130 | 13.2 | 25 |
| Comp. 5 | 105 | 9.8 | 7 |
| Comp. 6 | 110 | 11.5. | 12 |

The tantalum solid electrolytic capacitor according to any of Examples 11 to 13, 18 and 19 was so fabricated that the iron concentration of the first and second solid electrolytic layers 64 and 65 as a whole could be not greater than 100 ppm by immersing the anode element 42 into the electrolyte solution during the cleansing that took place after the chemical polymerization. As can readily be understood from Table 5, the tantalum solid electrolytic capacitor according to any one of Examples 11 to 13, 18 and 19 has shown excellent properties in all aspects of the leakage current and the number of occurrence of shortcircuit as compared with that according to Comparisons 4 to 6. Accordingly, it will readily be seen that the capacitor making method employed in any one of Examples 11 to 13, 18 and 19 is effective to manufacture the tantalum solid electrolytic capacitors at a high yield.

Also, the tantalum solid electrolytic capacitor according to any of Examples 14 to 17 was so fabricated that the iron concentration of the first and second solid electrolytic layers 64 and 65 as a whole could be not greater than 100 ppm by applying the voltage to the anode, defined by the anode element 42 having the solid electrolytic layers 64 and 65 made of the electroconductive polymer, while the anode element 42 was immersed in the electrolyte solution during the cleansing that took place after the chemical polymerization. The tantalum solid electrolytic capacitor according to Example 14 in which the voltage of a value 0.1 times the anodizing voltage of the dielectric oxide film 43 has shown no effect which ought to be brought about as a result of the voltage application. Also, the tantalum solid electrolytic capacitor according to Example 17 in which the voltage of a value 1.1 times the anodizing voltage of the dielectric oxide film 43 has shown reduction in electrostatic capacitance although the iron concentration of the solid electrolytic layers could be reduced.

Accordingly, where the solid electrolytic layers 64 and 65 are to be cleansed by applying the voltage while the anode element 42 is immersed in the electrolyte solution, the optimum value of the applied voltage is within the range of 0.2 to 1 times the anodizing voltage of the dielectric oxide film 43.

As discussed above, the solid electrolytic capacitor 54 according to the sixteenth embodiment of the present invention includes the solid electrolytic layers made of the electroconductive polymer and having the iron content not greater than 100 ppm by cleansing the anode element in the electrolyte solution or by applying the voltage with the anode element 42 used as an anode while the anode element 42 is cleansed in the electrolyte solution. The tantalum solid electrolytic capacitor 54 is effective to reduce the leakage current and also the number of occurrence of shortcircuit. Accordingly, since the solid electrolytic capacitors can be manufactured at a high yield, the industrial value thereof is remarkable.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A solid electrolytic capacitor which comprises:

an anode element made of a valve action metal;

a dielectric oxide film formed on a surface of the anode element;

a solid electrolytic layer formed on a surface of the dielectric oxide film and having an iron concentration not greater than 100 ppm, said solid electrolytic layer comprising a conductive polymer formed by a chemical oxidation polymerization employing a solution containing a heterocyclic compound monomer and an oxidizing agent containing iron (III); and a cathode layer formed on a surface of the solid electrolytic layer.

2. The solid electrolytic capacitor according to claim 1, wherein a weight fraction of said conductive polymer in said solid electrolytic layer is greater than 95 wt %.

3. The solid electrolytic capacitor according to claim 2, wherein the solid electrolytic layer is made of polypyrrole and/or polythiophene.

4. The solid electrolytic capacitor according to claim 1, wherein the solid electrolytic layer is made of polypyrrole and/or polythiophene.

5. A solid electrolytic capacitor which comprises:

an anode element made of a valve action metal;

a dielectric oxide film formed on a surface of the anode element;

a solid electrolytic layer formed on a surface of the dielectric oxide film, said solid electrolytic layer comprising a conductive polymer formed by a chemical oxidation polymerization employing a solution containing a heterocyclic compound monomer and an oxidizing agent containing iron (III); and a cathode layer formed on a surface of the solid electrolytic layer, wherein a weight fraction of residue in said solid electrolytic layer is smaller than 5 wt %, said residue comprising an unpolymerized monomer and said oxidizing agent.

6. The solid electrolytic capacitor according to claim 5, wherein the solid electrolytic layer is made of polypyrrole and/or polythiophene.

* * * * *